United States Patent [19]
Toda et al.

[11] Patent Number: 5,616,178
[45] Date of Patent: Apr. 1, 1997

[54] METHOD FOR GROWTH OF II-VI COMPOUND SEMICONDUCTORS

[75] Inventors: Atsushi Toda; Daisuke Imanishi, both of Kanagawa, Japan

[73] Assignee: Sony Corporation, Tokyo, Japan

[21] Appl. No.: 455,844

[22] Filed: May 31, 1995

[30] Foreign Application Priority Data

May 31, 1994 [JP] Japan .................................. 6-141236

[51] Int. Cl.⁶ .................................................. C30B 15/14
[52] U.S. Cl. ........................................... 117/104; 117/956
[58] Field of Search .................................... 117/104, 956

[56] References Cited

U.S. PATENT DOCUMENTS

| | | | |
|---|---|---|---|
| 4,650,539 | 3/1987 | Irvine et al. | 117/104 |
| 4,950,621 | 8/1990 | Irvine et al. | 117/104 |
| 5,423,284 | 6/1995 | Nishimura et al. | 117/104 |
| 5,456,207 | 10/1995 | Gedridge, Jr. et al. | 117/104 |

FOREIGN PATENT DOCUMENTS

| | | | |
|---|---|---|---|
| 2549 | 1/1987 | Japan | 117/104 |

OTHER PUBLICATIONS

A. Toda et al., "Blue–green ZnCdSe light–emitting diodes grown by MOCVD," Electronics Letters, 2nd Feb. 1995, vol. 31, No. 3, pp. 235–237.

W.S. Rees et al., "Synthesis, characterization and evaluation of zinc–amides as a potential dopant sources for ZnSe OMVPE" Chamical Perspectives of Microelectronic Materials III Symposium, Mater. Res. Soc., pp. 63–67, 1993.

Primary Examiner—Robert Kunemund
Attorney, Agent, or Firm—Hill, Steadman & Simpson

[57] ABSTRACT

A method for growth of II–VI compound semiconductors grows a p-type II–VI compound semiconductor such as a p-type ZnSe by vapor deposition such as metallorganic chemical vapor deposition and molecular beam epitaxy using gaseous materials. The method uses as a p-type dopant an organic compound including at least one nitrogen atom and at least two groups of atoms each having a molecular weight larger than 12 and both combined with the nitrogen atom. One of such organic compounds is di-isopropylamine.

10 Claims, 17 Drawing Sheets

METHOD FOR GROWTH OF II-VI COMPOUND SEMICONDUCTORS

BACKGROUND OF THE INVENTION

This invention relates to a method for growth of II–VI compound semiconductors, in particular, suitable for application to growth of p-type II–VI compound semiconductors.

Recently, demand has become greater and greater for semiconductor lasers capable of emitting light of short wavelengths, aiming improvements in recording density of optical disks and in resolution of laser printers, and efforts are devoted to developments of such lasers.

II–VI compound semiconductors are hopeful materials for fabricating semiconductor lasers for emitting light of short wavelengths. In particular, ZnMgSSe compound semiconductors, which are quaternary II–VI compound semiconductors, are known to be suitable materials for cladding layers and waveguide layers which are necessary for making on a GaAs substrate a semiconductor laser for emission of blue to green light in the band of wavelengths of 400 to 550 nm (for example, Electron. Lett. 28, 1798(1992)).

Heretofore, growth of a II–VI compound semiconductor wholly relied on molecular beam epitaxy (MBE) which is, however, unsatisfactory from the viewpoint of productivity. In more recent years, efforts were made to employ metal-lorganic chemical vapor deposition (MOCVD), which has an excellent productivity and has widely been used for growth of III–V compound semiconductors, also for growth of II–VI compound semiconductors.

On the other hand, nitrogen (N) has conventionally been most used as an acceptor impurity for making p-type ZnSe or other p-type II–VI compound semiconductors. Typically used as p-type dopants for growth of such p-type II–VI compound semiconductors are compounds such as ammonia ($NH_3$), tertiary butylamine (t—$BNH_2$), hydrazine ($N_2H_4$), and so forth.

However, the N doping efficiency is very low when using $NH_3$, t—$BNH_2$, $N_2H_4$ or other like compounds as p-type dopants, which means that a large amount of such dopants must be supplied for doping a sufficient amount of N. For example, it was reported that, when using $NH_3$ as a p-type dopant, an amount of $NH_3$ as large as thousands of μmol/minutes must be supplied to see apparent doping of N (for example, J. Crystal Growth 101, 305(1990) and J. Crystal Growth 99, 413(1990)). For these reasons, it has been difficult to realize growth of p-type II–VI compound semiconductors with a sufficiently high doping concentration of N, that is, with a sufficiently high acceptor concentration. Specifically, in case of p-type ZnSe, maximum acceptor concentration has been $1 \times 10^{16}$ cm$^{-3}$ even with all possible efforts.

One of some reasons of N doping efficiency being low is that N is not readily incorporated in crystals under growth. It can be assumed that, due to a very high vapor pressure of nitrogen molecules ($N_2$) at growth temperatures, most of N atoms to be doped may desorb in the form of $N_2$ while migrating along the surface of a crystal under growth. The next statement shows that the vapor pressure of $N_2$ at growth temperatures is actually very high. That is, the vapor pressure of $N_2$ can be expressed by the following equation, called Antoine's Equation, $$\log(p/mmHg) = 6.49594 - 255.821/(266.56 + (T/°C.))$$

(for example, Chemical Handbook, Basic Volume II (Chemical Society of Japan)). It is known from this equation that the vapor pressure of $N_2$ at a typical temperature, 500° C., for growth of II–VI compound semiconductors is $1.45 \times 10^6$ Torr, which is as high as 1860 times the normal pressure (1 atm).

Methods for solving the problem of desorption of N include plasma doping which is often used for growth of II–VI compound semiconductors by MBE. This method dopes $N_2$ in the form of plasma, which might promote its combination with other atoms on the surface of the crystal (mainly, atoms of group II elements) and hence prevent desorption of N. However, the use of plasma doping in growth of II–VI compound semiconductors by MOCVD involves a difficulty due to the excessively high pressure. That is, while the pressure within the reaction tube during growth by MOCVD ranges from the normal pressure to several Torr, even under reduced pressure, such a high pressure significantly reduces the life of plasma, and nitrogen no longer maintains the phase of plasma when reaching the surface of the substrate.

As explained above, it has been difficult to realize growth of p-type II–VI compound semiconductors with a sufficiently high acceptor concentration. This is a large obstacle to fabrication of light emitting devices such as semiconductor lasers or light emitting diodes by using II–VI compound semiconductors, and improvements have been longed for.

OBJECTS AND SUMMARY OF THE INVENTION

It is, therefore, an object of the invention to provide a method for growth of II–VI compound semiconductors capable of realizing growth of p-type II–VI compound semiconductors with a high doping concentration of nitrogen as an acceptor impurity, that is, with a high acceptor concentration.

According to the invention, there is provided a method for growing a II–VI compound semiconductor which grows a p-type II–VI compound semiconductor by vapor deposition using a material of a group II element, a material of group VI element, and a p-type dopant, comprising: the p-type dopant being an organic compound including at least one nitrogen atom and at least two groups of atoms each having a molecular weight larger than 12 and both combined with the nitrogen atom.

The two groups of atoms combined with each nitrogen atom in the organic compound as a p-type dopant each have a molecular weight preferably larger than 36 so as to facilitate thermal decomposition and liberation of the groups of atoms from the nitrogen atom at typical temperatures, about 500° C., for growth of II–VI compound semiconductors. Also, the two groups of atoms are preferably equal in molecular weight such that their thermal decomposition and liberation from the nitrogen atom proceed with equivalent probabilities.

The organic compound used as the p-type dopant is, typically, either an organic compound including at least one nitrogen atom, at least two groups of atoms each having a molecular weight larger than 36 and both combined with the nitrogen atom and a hydrogen atom combined with the nitrogen atom, or an organic compound including at least one nitrogen atom and three groups of atoms each having a molecular weight larger than 36 and all combined with the nitrogen atom. Examples of the former organic compound are (a) to (f) shown below, and examples of the latter organic compound are (g) to (r).
(a) di-isopropylamine (Di-PNH)
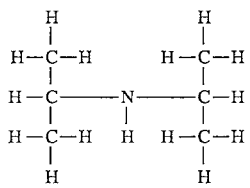
(b) dipropylamine (D-PNH)
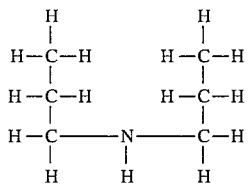
(c) dibutylamine (D-BNH)
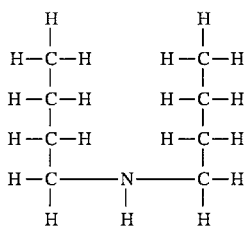
(d) di-isobutylamine (Di-BNH)
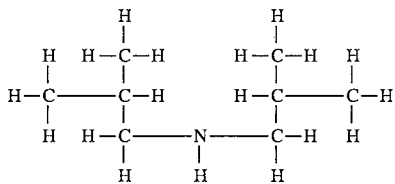
(e) di-secondary-butylamine) Ds-BNH)
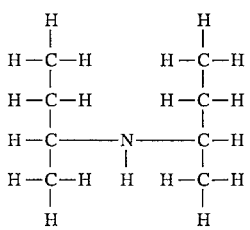
(f) di-tertiary-butylamine (Dt-BNH)
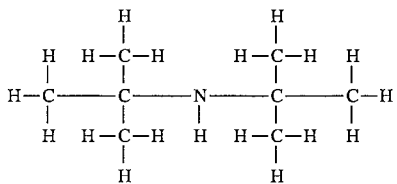
(g) tripropylamine (T-PN)
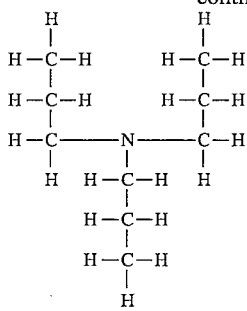
(h) tri-isopropylamine (Ti-PN)
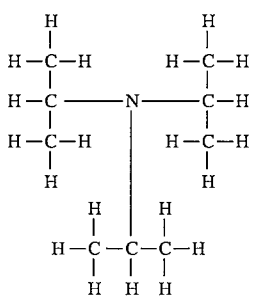
(i) tri-butylamine (T-BN)
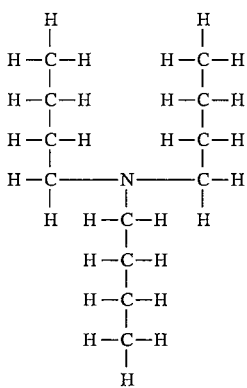
(j) tri-isobutylamine (Ti-BN)
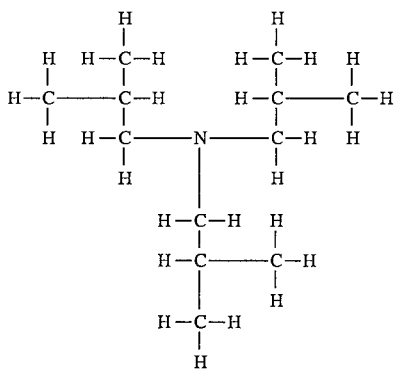
(k) tri-secondary-butylamine (Ts-BN)

-continued

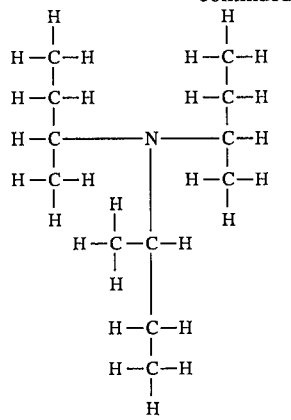

(l) tri-tertiary-butylamine (Tt-BN)

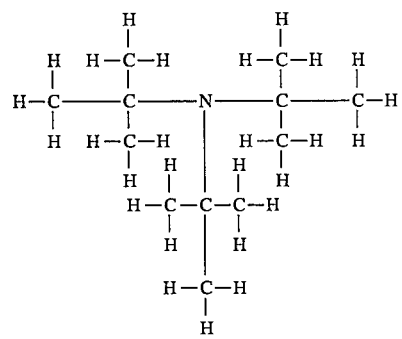

(m) di-isopropyl methylamine (Di-PMN)

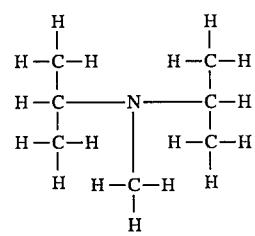

(n) dipropyl methylamine (D-PMN)

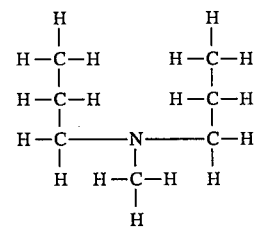

(o) dibutyl methylamine (D-BMN)

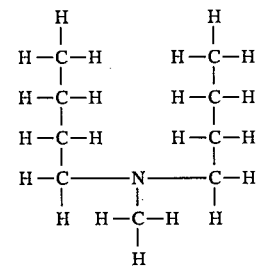

(p) di-isobutyl methylamine (Di-BMN)

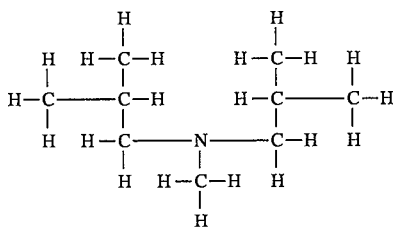

(q) di-secondary-butylmethylamine (Ds-BMN)

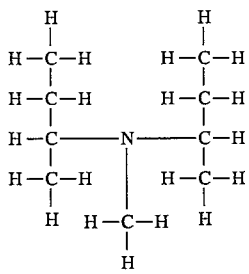

(r) di-tertiary butylmethylamine (Dt-BMN)

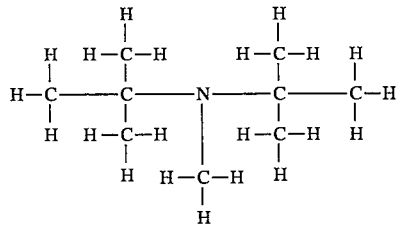

Comparison of the above-indicated organic compounds (a) to (r) with below-indicated ammonia ($NH_3$) and tertiary butylamine (t—$BNH_2$), which were conventionally used as p-type dopants, reveals that $NH_3$ and t-$BNH_2$ each include one or no group of atoms combined with each N atom and two or three H atoms in direct combination with each N atom; however, the organic compounds (a) to (r) each have two or three groups of atoms combined with each N atom and one or no H atom in direct combination with each N atom.

(s) ammonia ($NH_3$)

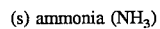
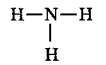

(t) tertiary butylamine (t-$BNH_2$)

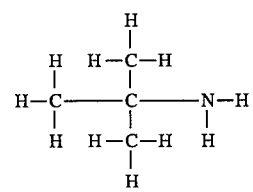

In a preferred aspect of the invention, nitrogen atoms are delta-doped (δ-doped) on the plane of group II elements of the II–VI compound semiconductor. The δ-doping may be replaced by a flow modulation method which provides the same effect as the delta doping. More specifically, the flow modulation method temporarily interrupt the growth by interrupting the supply of the material of the group VI element while maintaining the the supply of the material of the group II element and the p-type dopant.

Vapor deposition used in the invention may be either MOCVD or MBE using gaseous materials.

The II–VI compound semiconductor grown by the invention is, for example, a $Zn_{1-a-b}Mg_aCd_bS_cTe_dSe_{1-c-d}$ compound semiconductor (where $0 \leq a, b, c, d < 1$), such as ZnSe, ZnSSe, ZnCdSe, ZnMgSSe, and so forth.

Since the method for growing a II–VI compound semiconductor according to the invention, configured as described above, uses a p-type dopant comprising an organic compound which includes at least one nitrogen atom and at least two groups of atoms each having a molecular weight larger than 12 and both combined with each nitrogen atom, once these groups of atoms are liberated from the nitrogen atom due to thermal decomposition, the nitrogen atom has at least two dangling bonds, at least one bond more than the dangling bond or bonds of each nitrogen atom generated by thermal decomposition of $NH_3$ and Di—PNH which were conventionally used as p-type dopants. So much, nitrogen atoms readily bond to atoms on the surface of a crystal under growth and are readily incorporated into the crystal, which results in a higher doping efficiency of nitrogen atoms into the II–VI compound semiconductor to be grown. Therefore, II–VI compound semiconductors can be grown with a sufficiently high doping concentration of nitrogen atoms as an acceptor impurity, that is, with a sufficiently high acceptor concentration.

When used as the p-type dopant is an organic compound, in particular, including one nitrogen atom and three groups of atoms of a molecular weight larger than 36 combined with the nitrogen atom, thermal decomposition results in producing sole nitrogen atoms not combined with hydrogen atoms. Therefore, it is also possible to solve the problem that hydrogen atoms contained in an organic compound used as a p-type dopant are captured into the crystal under growth and inactivate nitrogen atoms as its acceptor impurity, that is, the problem of passivation of nitrogen atoms by hydrogen atoms (see, for example, Appl. Phys. Lett. 62, 270(1991)). Thus, II–VI compound semiconductors with even higher acceptor concentrations can be grown.

In addition, delta-doping of nitrogen atoms on the plane of group II elements of a II–VI compound semiconductor or the use of a flow modulation method can yet further increase the efficiency of incorporation of nitrogen atoms into the crystal under growth, and hence can grow a p-type II–VI compound semiconductor with a yet higher acceptor concentration.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention are explained below with reference to the drawings.

Figure 1:
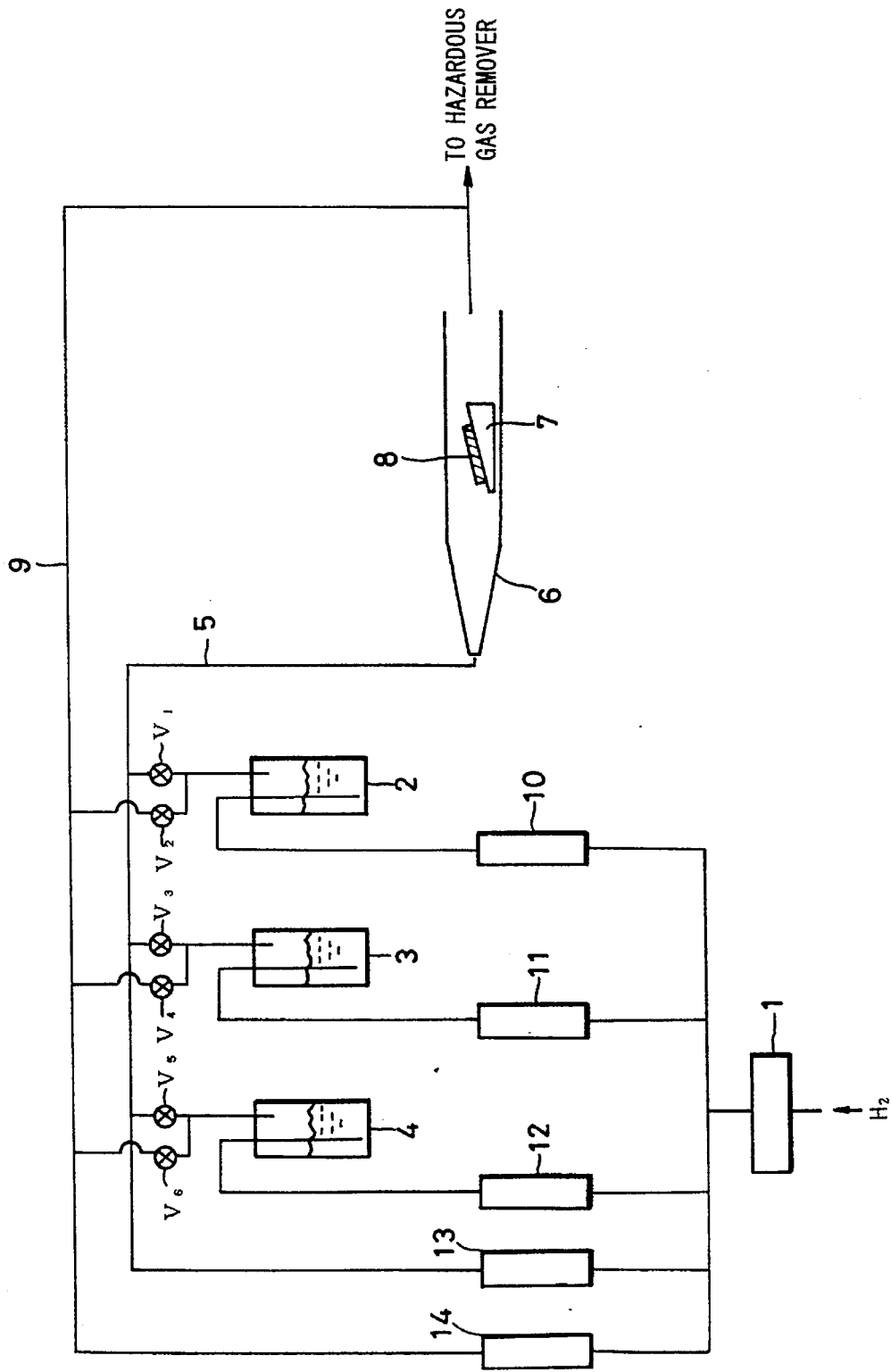
FIG. 1 is a schematic diagram showing the construction of an MOCVD system used in a first embodiment of the invention.

First explained is an MOCVD system used in a first embodiment of the invention. FIG. 1 shows the construction of the MOCVD system.

As shown in FIG. 1, in the MOCVD system, hydrogen ($H_2$) gas highly purified by a $H_2$ purifier 1 is introduced as a carrier gas to bubblers 2, 3 and 4. Assume here that p-type ZnSe is to be grown. Then, the bubbler 2, 3 and 4 contain, for example, di-methyl zinc (DMZn) as a material of Zn, di-methyl selenium (DMSe) as a material of Se, and Di—PNH as a p-type dopant, respectively. When $H_2$ gas is supplied to the bubblers 2, 3 and 4, source gases in certain amounts determined by the vapor pressure are supplied as carrier gases from the bubblers 2, 3 and 4 together with $H_2$ gas through a reaction tube line 5 into a reaction tube 6. The reaction tube 6 contains a susceptor 7 for supporting a substrate 8 on it.

Reference numeral 9 denotes a vent line. Switching between the reaction line 5 for the source gas from the bubbler 2 and the vent line 9 may be done by opening and closing valves $V_1$ and $V_2$, switching between the reaction tube line 5 for the source gas from the bubbler 3 and the vent line 9 by opening and closing valves $V_3$ and $V_4$, and switching between the reaction tube line 5 for the dopant gas from the bubbler 4 and the vent line 9 by opening and closing valves $V_5$ and $V_6$. Reference numerals 10 to 14 denote mass-flow controllers for controlling flow amounts of $H_2$ gas supplied from the $H_2$ purifier 1.

Figure 2:
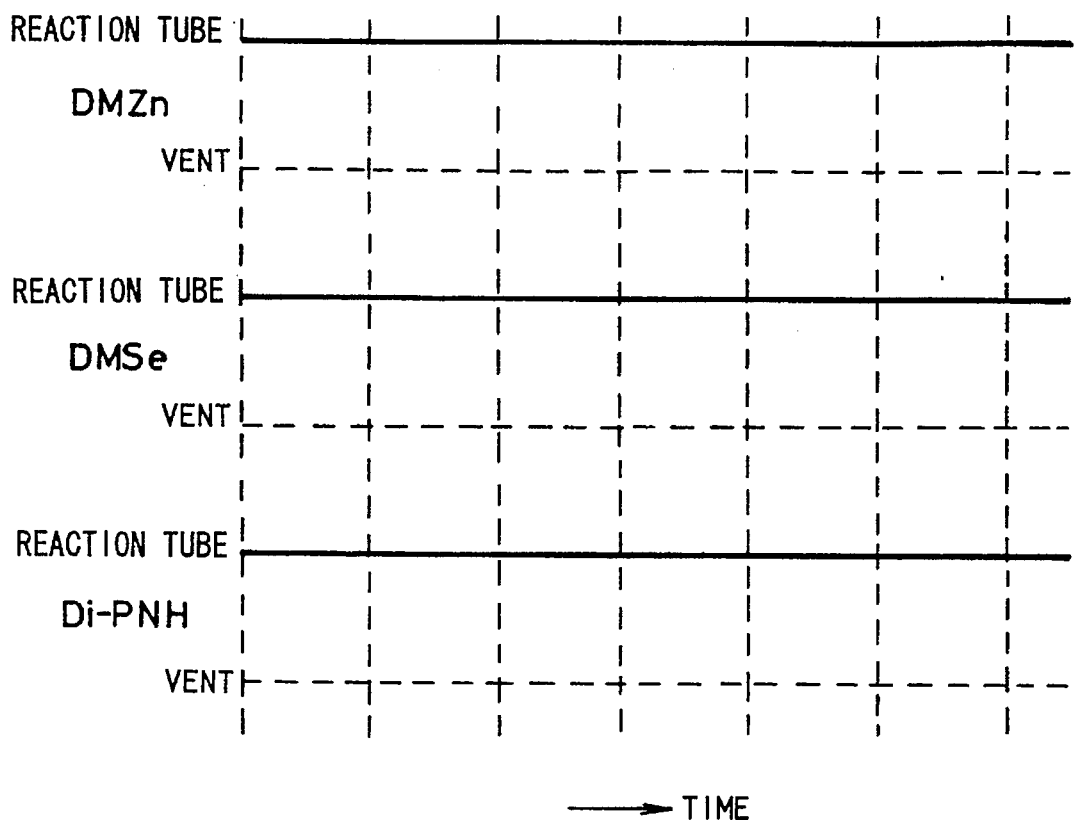
FIG. 2 is a sequence diagram for explaining a method for growth of p-type ZnSe according to the first embodiment of the invention.

FIG. 2 is a sequence diagram showing an aspect of the supply of the source gases and the supply of the dopant gas in the method for growth of p-type ZnSe according to the first embodiment of the invention.

In the first embodiment, the process begins with placing a semi-insulating GaAs substrate 21 (FIG. 3) as the substrate 8 on the susceptor 7 in the reaction tube 6 of the MOCVD system shown in FIG. 1. The semi-insulating GaAs substrate 21 is heated by the susceptor 7 to an appropriate growth temperature in Ha gas.

Figure 3:
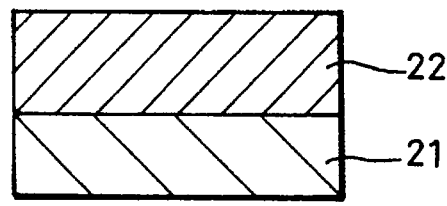
FIG. 3 is a cross-sectional view for explaining the method for growth of p-type ZnSe according to the first embodiment of the invention.

Subsequently supplied to the reaction tube 6 are DMZn as a material of Zn, DMSe as a material of Se, and Di—PNH as a p-type dopant, altogether simultaneously (FIG. 2). Then, as shown in FIG. 3, an N-doped ZnSe layer (called ZnSe:N layer in the first and a following second embodiments) 22 is epitaxially grown on the semi-insulating GaAs substrate 21.

Figure 4:
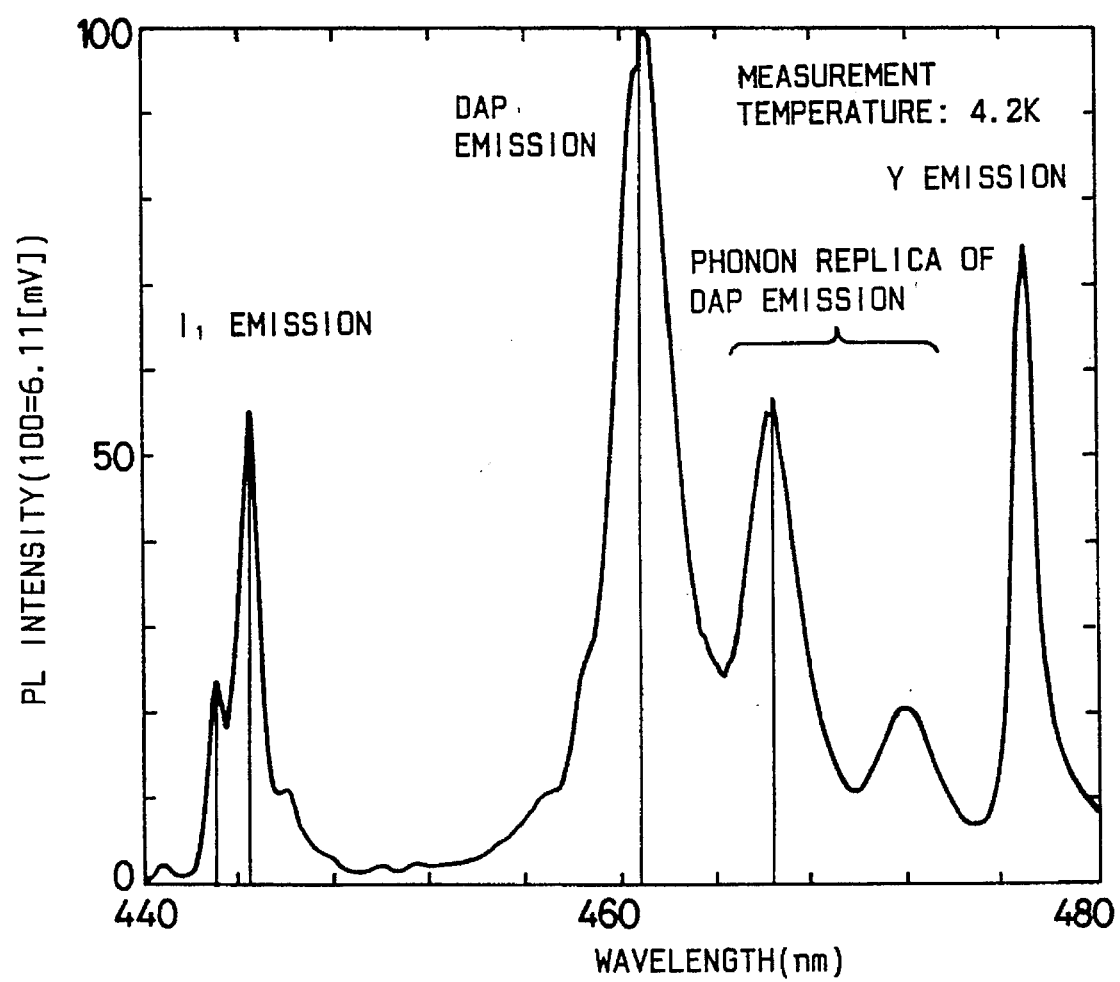
FIG. 4 is a graph showing a result of measurement of photoluminescence spectrum of the p-type ZnSe layer grown by the method according to the first embodiment of the invention.

FIG. 4 shows a result of measurement of photoluminescence spectrum of the epitaxially grown ZnSe:N layer 22 at 4.2K (liquid helium temperature). The growth temperature is 450° C., and the pressure in the reaction tube 6 is 650 Torr. Supplied amounts of DMZn, DMSe and Di—PNH are 5 μmol/minutes, 10 μmol/minutes, and 141 μmol/minutes, respectively.

Figure 5:
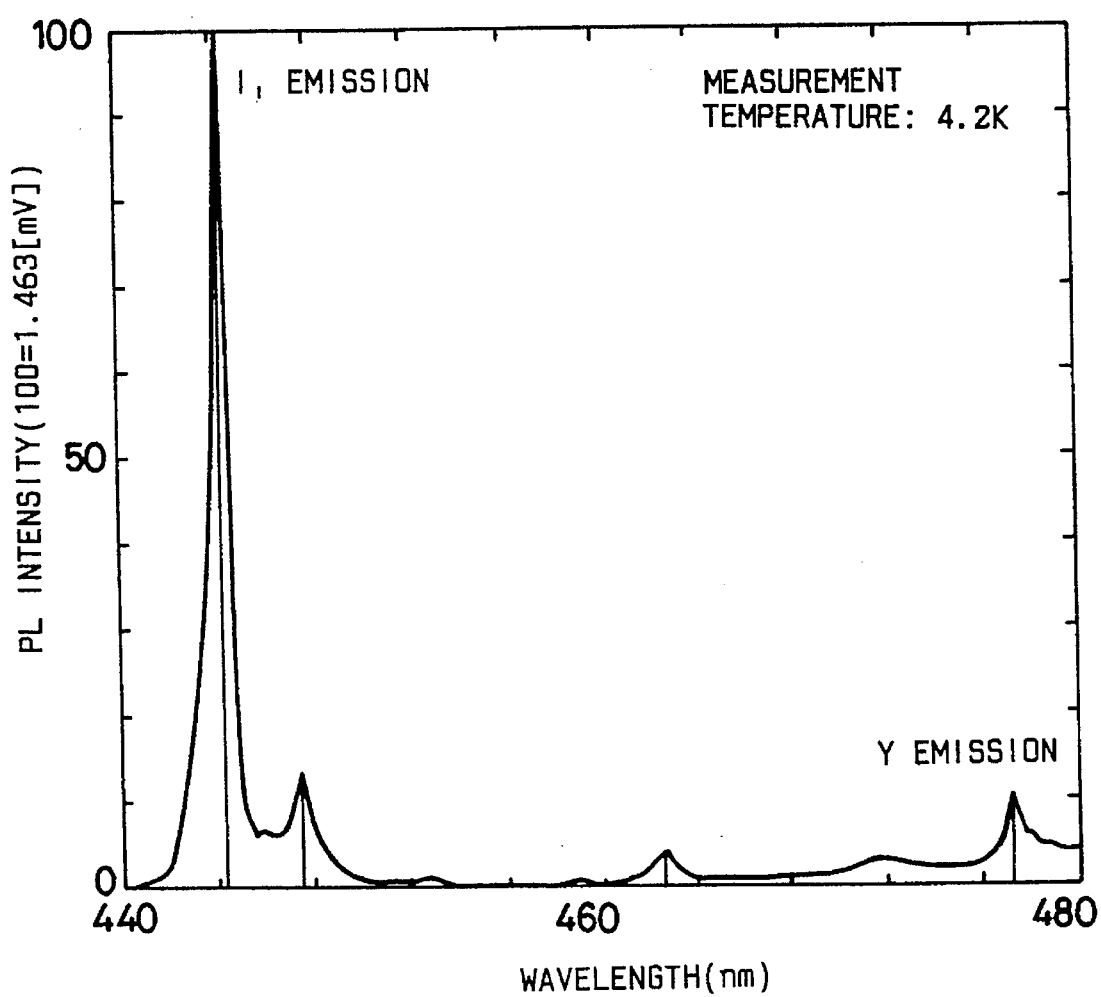
FIG. 5 is a graph showing a result of measurement of photoluminescence spectrum of the p-type ZnSe layer grown by MOCVD using t—$BNH_2$ as a p-type dopant.

On the other hand, for the purpose of comparison, a sample with a ZnSe:N layer epitaxially grown on a semi-insulating GaAs substrate was made by simultaneously supplying the reaction tube 6 with DMZn as a material of Zn, DMSe as a material of Se, and t—$BNH_2$ as a p-type dopant, altogether, in the same manner as epitaxial growth by conventional MOCVD, and photoluminescence spectrum of the ZnSe:N layer was measured at 4.2K. Its result is shown in FIG. 5. The growth temperature is 450° C., and the pressure in the reaction tube 6 is 650 Torr. Supplied amounts of DMZn, DMSe and t—$BNH_2$ are 5 μmol/minutes, 10 μmol/minutes, and 180 μmol/minutes, respectively. Note that FIGS. 4 and 5 have different full scales on their vertical axes.

The greatest difference between FIGS. 4 and 5 is whether DAP (donor-acceptor pair) emission occurs or not near the wavelength of 460 nm. FIG. 4 shows an intensive DAP emission, but FIG. 5 shows substantially no DAP emission. This DAP emission is an evidence that N has been doped, and the larger the intensity, the larger the doped amount of N. It is presumed from FIGS. 4 and 5 that the ZnSe:N layer 22 grown by the method according to the first embodiment is doped with a larger amount of N than a ZnSe:N layer grown by conventional MOCVD using t—$BNH_2$ as a p-type dopant.

In FIGS. 4 and 5, peaks except for the DAP emission represent $I_1$ (neutral acceptor bound exciton) emission, phonon replica of DAP emission, and Y emission (emission caused by misfit dislocation or the like).

Figure 6:
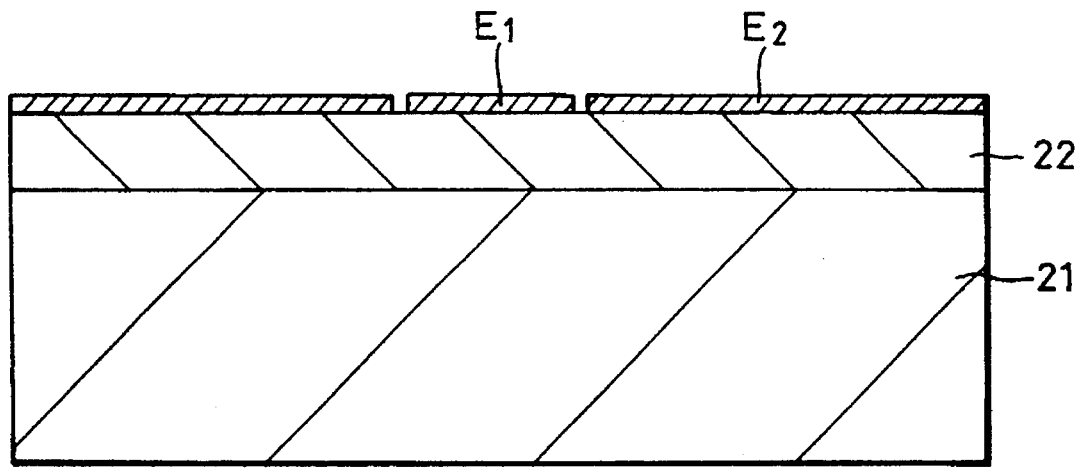
FIG. 6 is a cross-sectional view of a sample used in C-V measurement for quantitative evaluation of acceptor concentration of the p-type ZnSe layer grown by the method according to the first embodiment of the invention.
Figure 7:
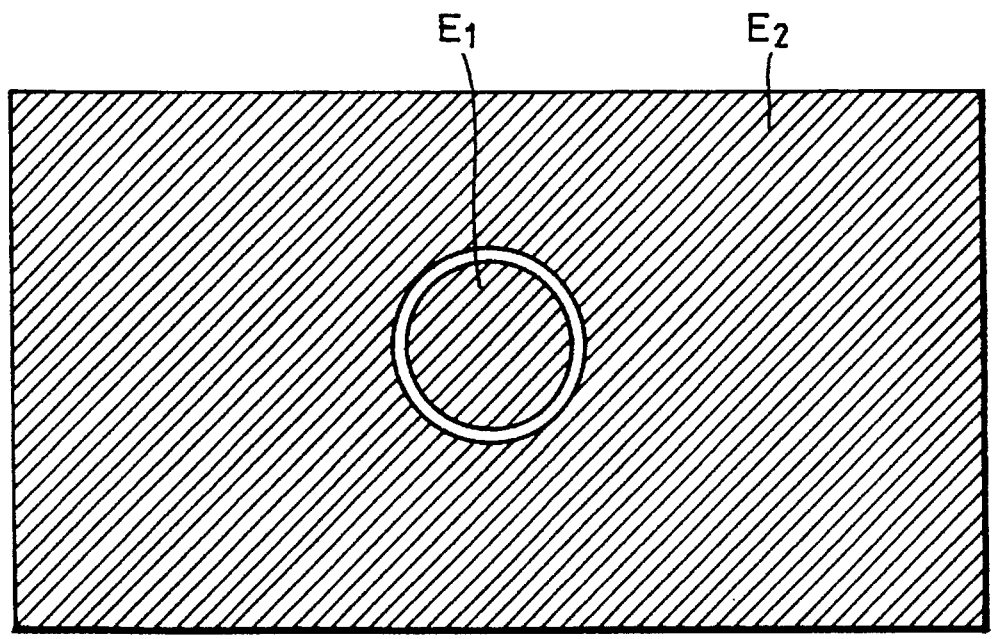
FIG. 7 is a plan view of the sample used in C-V measurement for quantitative evaluation of the acceptor concentration of the p-type ZnSe layer grown by the method according to the first embodiment of the invention.

For the purpose of capacitance(C)-to-voltage(V) measurement for quantitative evaluation of the doped amount of N in the ZnSe:N layer 22 grown by the method according to the first embodiment, a sample was made as shown in FIGS. 6 and 7 by making a 1.3 Bm thick ZnSe:N layer 22 on a semi-insulating GaAs substrate 21 by epitaxial growth and by making a circular gold (Au) electrode $E_1$ and a surrounding Au electrode $E_2$ on the ZnSe:N layer 22 by vacuum evaporation. The area of the surrounding Au electrode $E_2$ is sufficiently larger than the area of the circular Au electrode $E_1$ such that the surrounding Au electrode $E_2$ can be regarded approximatively as an ohmic electrode. In this case, the diameter of the circular Au electrode $E_1$ is 336 μm.

Figure 8:
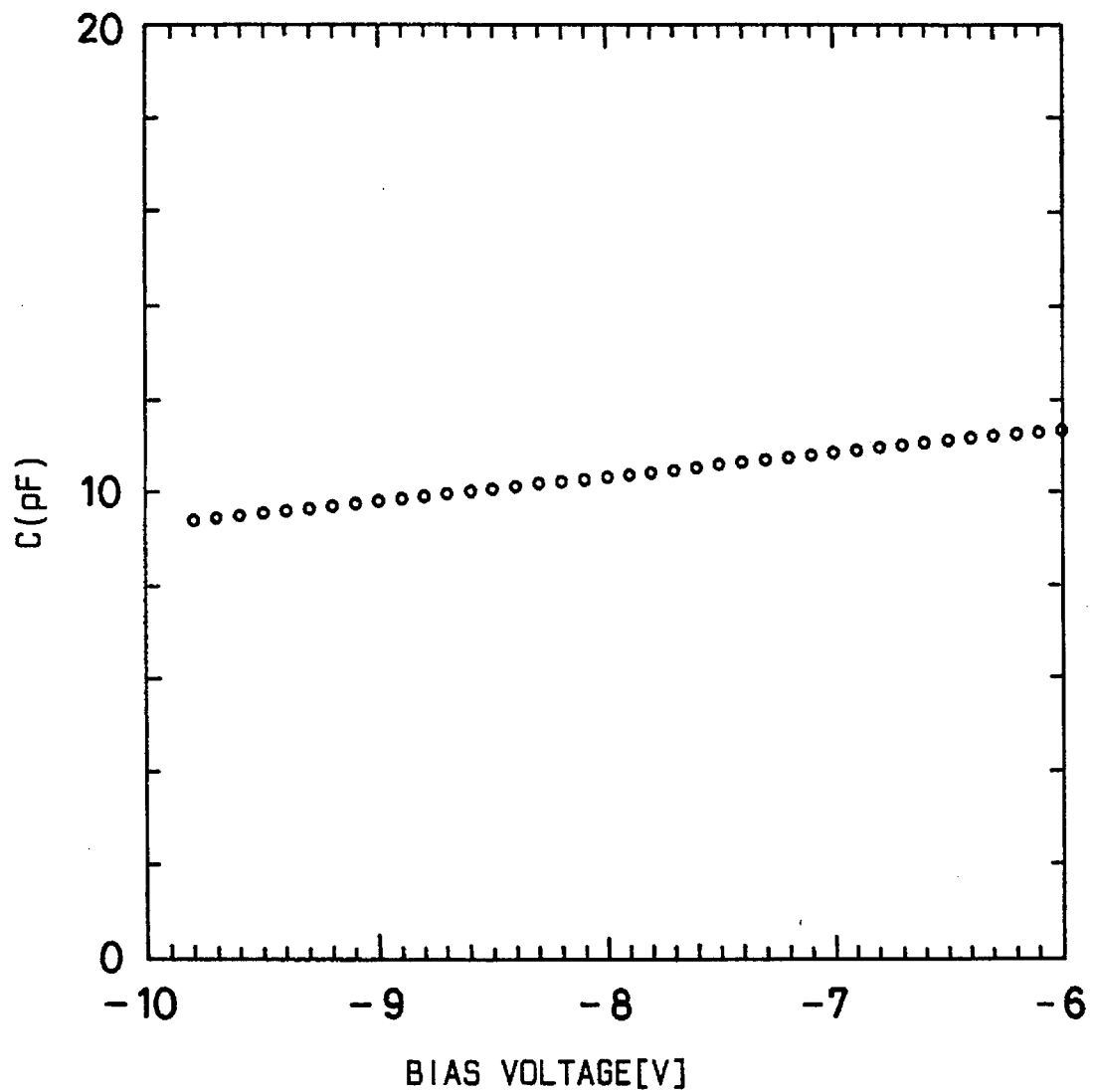
FIG. 8 is a graph showing a result of C-V measurement of the sample shown in FIGS. 6 and 7.
Figure 9:
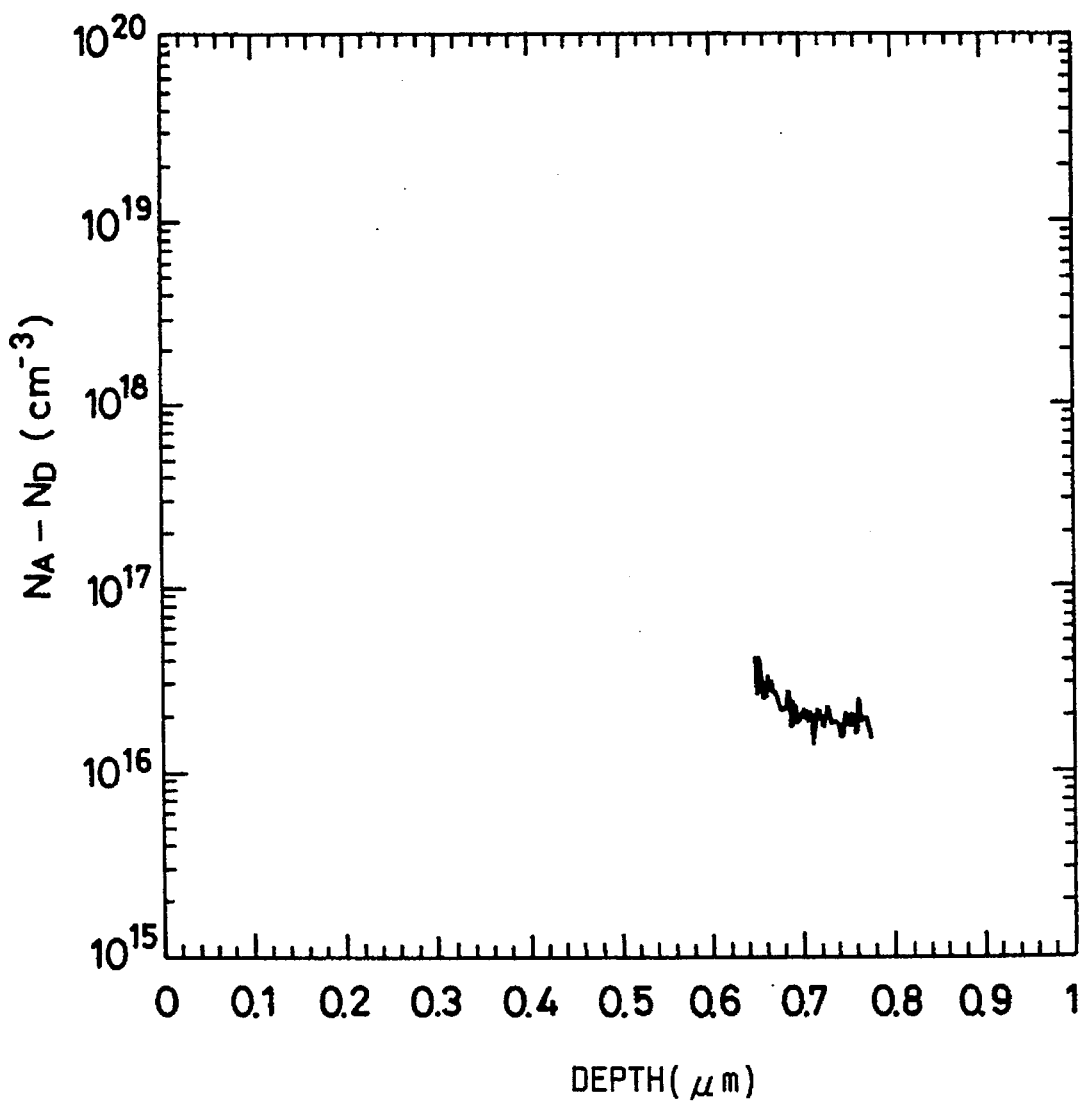
FIG. 9 is a graph showing a profile of the effective acceptor concentration obtained by the result of C-V measurement shown in FIG. 8.

With the sample shown in FIGS. 6 and 7, C-V measurement was made by applying a positive bias voltage and a negative bias voltage to the circular Au electrode $E_1$ and the surrounding Au electrode $E_2$, respectively. The result is shown in FIG. 8. It is known from FIG. 8 that the capacitance (C) tends to decrease as the negative bias voltage becomes larger. Additionally, with the specific dielectric constant of ZnSe being 9.3, the effective acceptor concentration ($N_A-N_D$ ($N_A$: acceptor concentration, $N_D$: donor concentration)) was estimated in the direction downward from the surface of the ZnSe:N layer 22, and the result shown in FIG. 9 was obtained. $N_A-N_D$ obtained from this result was $N_A-N_D\sim 2\times 10^{16} cm^{-3}$. This order of acceptor concentration is sufficient for fabrication of light emitting devices such as semiconductor lasers, which means that Di—PNH is effective as a p-type dopant for growth of II–VI compound semiconductors by MOCVD.

Figure 10:
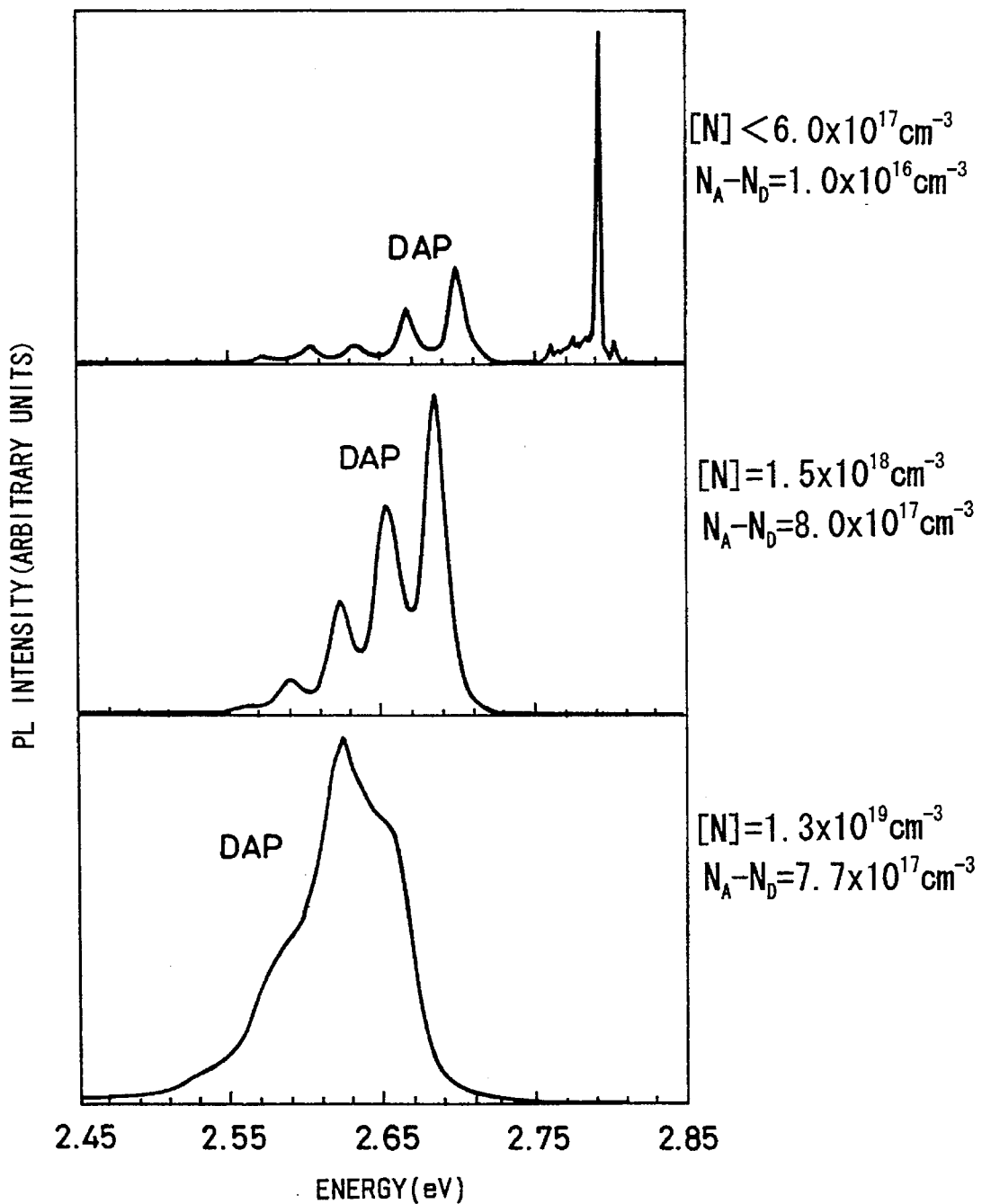
FIG. 10 is a graph showing the relation between acceptor concentration and photoluminescent intensity of p-type ZnSe.

Approximate estimation of the doped amount of N in the ZnSe:N layer 22 is possible even by the following method, without actual C-V measurement referred to above. Intensity of DAP emission and acceptor concentration, in general, have a close relation such that the higher the acceptor concentration, the larger the relative intensity of DAP emission. FIG. 10 shows low-temperature photoluminescence spectrum relative to N concentration ([N]) measured by secondary ion mass spectrometry and effective acceptor concentration ($N_A-N_D$) measured by C-V measurement, which was reported by J. Qiu et al. (Appl. Phys. Lett. 59, 2992(1991)). Another similar result was also reported by Z. Yang et al. (Appl. Phys. Lett. 61, 2671(1992)). It can be estimated from FIG. 10 that acceptor concentration in terms of effective acceptor concentration by C-V measurement of the ZnSe:N layer 22 grown by the method according to the first embodiment is in the range of $1.0\times 10^{16} cm^{-3} < N_A - N_D < 8.0 \times 10^{17} cm^{-3}$.

As stated above, the method of growth according to the first embodiment can grow the ZnSe:N layer 24 doped with a high concentration of N, that is, the p-type ZnSe layer with a high acceptor concentration by using Di—PNH as a p-type dopant. A reason why growth of such a p-type ZnSe layer with a high acceptor concentration is that, since N atoms generated by thermal decomposition of Di—PNH during the growth each have two dangling bonds, and are more readily incorporated into ZnSe crystal with a higher efficiency, which hence results in a high N doping efficiency.

Next explained below is a second embodiment of the invention configured to dope N by employing a flow modulation process providing a substantially equivalent effect as δ-doping.

Figure 11:
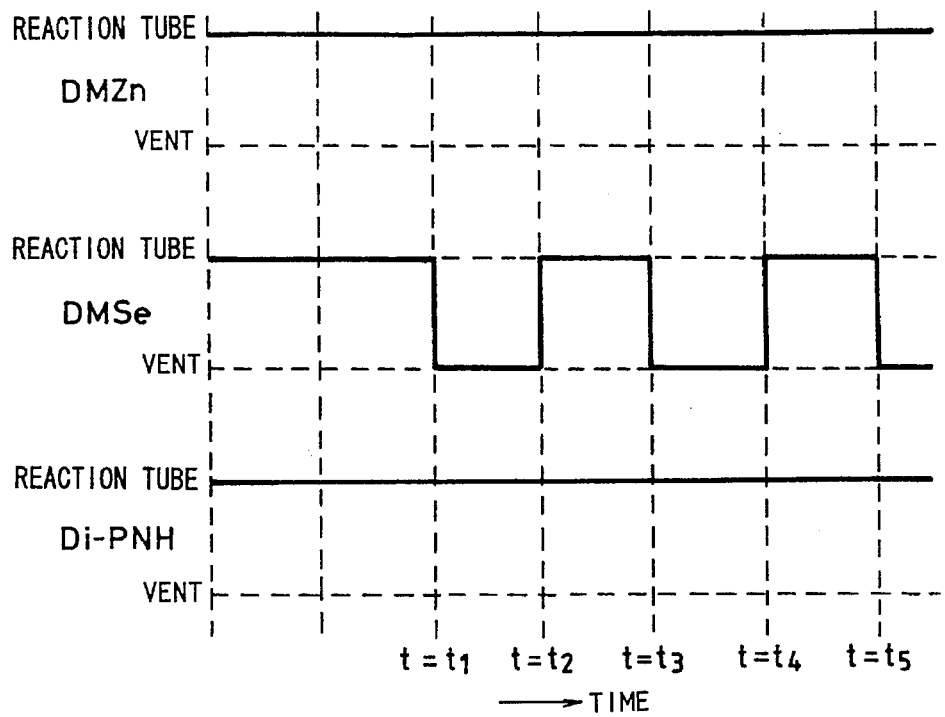
FIG. 11 is a sequence diagram for explaining a method for growth of p-type ZnSe according to a second embodiment of the invention.

FIG. 11 is a sequence diagram showing an aspect of supply of source gases and a dopant gas in the method for growth of p-type ZnSe according to the second embodiment of the invention. FIGS. 12A to 12E show aspects of layers under growth at different points $t=t_1, t_2, t_3, t_4$ and $t_5$ in FIG. 11.

The method for growing p-type ZnSe according to the second embodiment is explained below with reference to FIGS. 1, 11 and 12A to 12E.

The process begins with placing a semi-insulating GaAs substrate 21 as the substrate 8 on the susceptor 7 in the reaction tube 6 of the MOCVD system shown in FIG. 1. The semi-insulating GaAs substrate 21 is heated by the susceptor 7 to an appropriate growth temperature in $H_2$ gas.

Figure 12A:
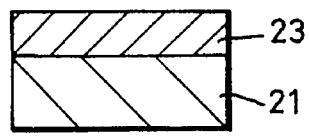
FIGS. 12A to 12E are cross-sectional views for explaining the method of growth of p-type ZnSe according to the second embodiment of the invention.

Subsequently supplied to the reaction tube 6 are DMZn as a material of Zn, DMSe as a material of Se, and Di—PNH as a p-type dopant, altogether simultaneously. Then, as shown in FIG. 12A, a ZnSe:N layer 23 is epitaxially grown on the semi-insulating GaAs substrate 21. The epitaxial growth of the ZnSe:N layer 23 begins at the time t=0 and ends at the time $t=t_1$ (FIG. 11). The ZnSe:N layer 23 made by the initial epitaxial growth behaves as a buffer layer for a subsequently grown ZnSe:N layer.

Figure 12B:
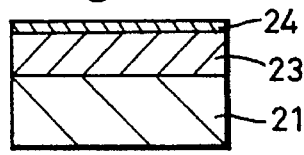

At the time $t=t_1$, the supply of DMSe is interrupted, while continuing the supply of DMZn and Di—PNH, to interrupt the growth. The interruption of the growth continues up to the time $t=t_2$. During the interruption of the growth, due to thermal decomposition of DMZn still supplied into the reaction tube 6, Zn attaches to the surface of the ZnSe:N layer 23 behaving as the buffer layer, which results in a Zn adsorptive layer covering the surface, and N having two dangling bonds generated by thermal decomposition of Di—PNH attaches to Zn of the Zn adsorptive layer, which results in N being incorporated into the growth layer. In FIG. 12B, the adsorptive layer of Zn and N is labelled 24.

Figure 13A:
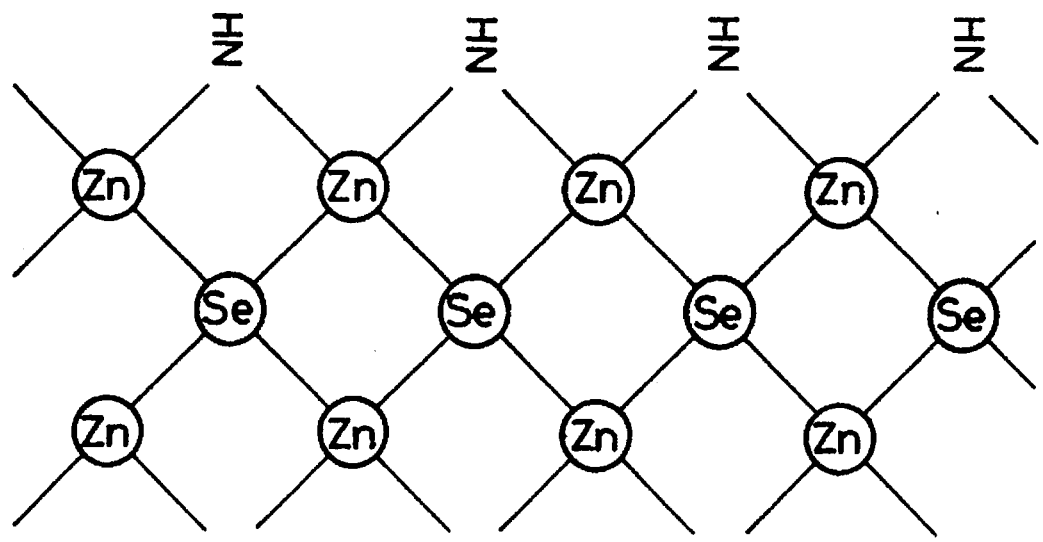
FIGS. 13A and 13B are schematic comparative diagrams of the state where NH generated by thermal decomposition of Di—PNH combines with Zn atoms on the Zn plane of a ZnSe crystal and the state where $NH_2$ generated by thermal decomposition of t—$BNH_2$ has combined with each Zn atom on the Zn plane of the ZnSe crystal.
Figure 13B:
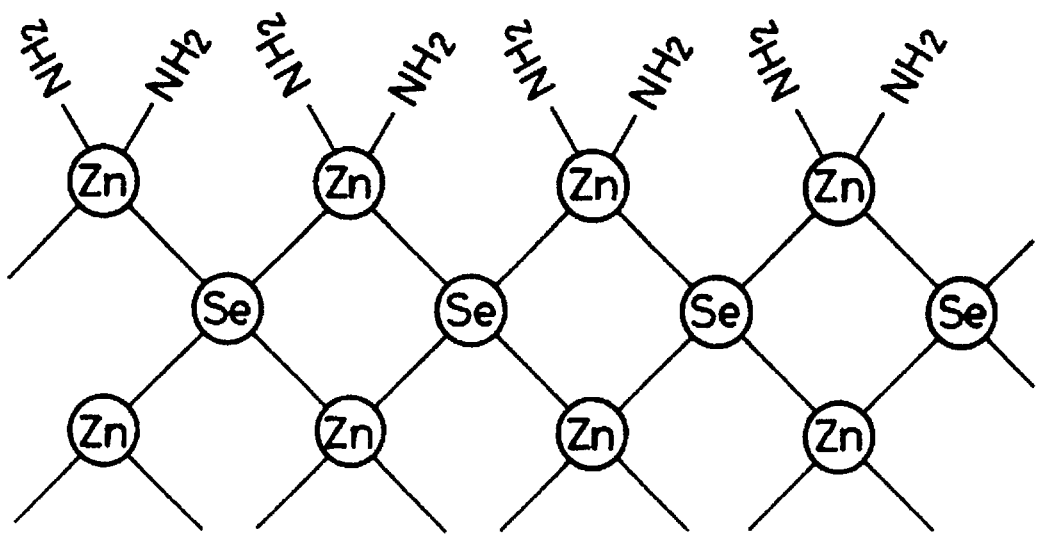

FIG. 13A shows an aspect where N atoms generated by thermal decomposition of Di—PNH and each having two dangling bonds combine with Zn, group II element, on a Zn plane of the ZnSe crystal. As shown in FIG. 13A, since each N atom combines with two Zn atoms on the Zn plane through its two dangling bonds, the force of combination between Zn atoms and N atoms is strong, and N atoms do not desorb easily. Additionally, N atoms combine with Zn atoms, faithfully reflecting the crystal structure of ZnSe. On the other hand, when t—$BNH_2$ is used as a p-type dopant, each of N atoms generated by thermal decomposition of t—$BNH_2$ has only one dangling bond, and two N atoms combine with each Zn atom on the Zn plane through their respective single bonds as shown in, FIG. 13B. Therefore, the bond strength of N atoms with Zn atoms is weak, and N atoms desorb easily, which results in redundant N atoms being present in the crystal.

Figure 12C:
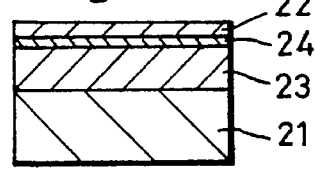

The supply of DMSe into the reaction tube 6 is resumed at the time $t=t_2$ and continued up to the time $t=t_3$. The reaction tube 6 is thus supplied with DMZn, DMSe and Di—PNH altogether simultaneously, and a thin ZnSe:N layer 22 is epitaxially grown as shown in FIG. 12C.

Figure 12D:
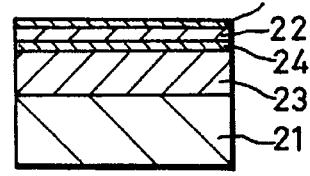

Then, at the time $t=t_3$, the supply of DMSe is again interrupted, while continuing the supply of DMZn and Di—PNH, to interrupt the growth. During the interruption of the growth, as shown in FIG. 12D, an adsorptive layer 24 of Zn and N is formed on the ZnSe:N layer 22.

Figure 12E:
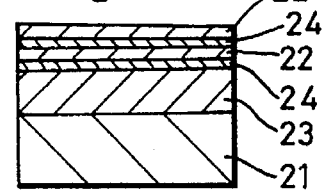

At the time $t=t_4$, the supply of DMSe into the reaction tube 6 is again resumed and continued until the time $t=t_5$. The reaction tube 6 is thus supplied with DMZn, DMSe and Di—PNH altogether simultaneously, and another thin ZnSe:N layer 22 is epitaxially grown as shown in FIG. 12E.

In this manner, the step of making the adsorptive layer 24 of Zn and N by interruption of the growth and the step of epitaxially growing the thin ZnSe:N layer 22 are repeated desired times, until the ZnSe:N layers 22 having a desired entire thickness is grown epitaxially.

Figure 14:
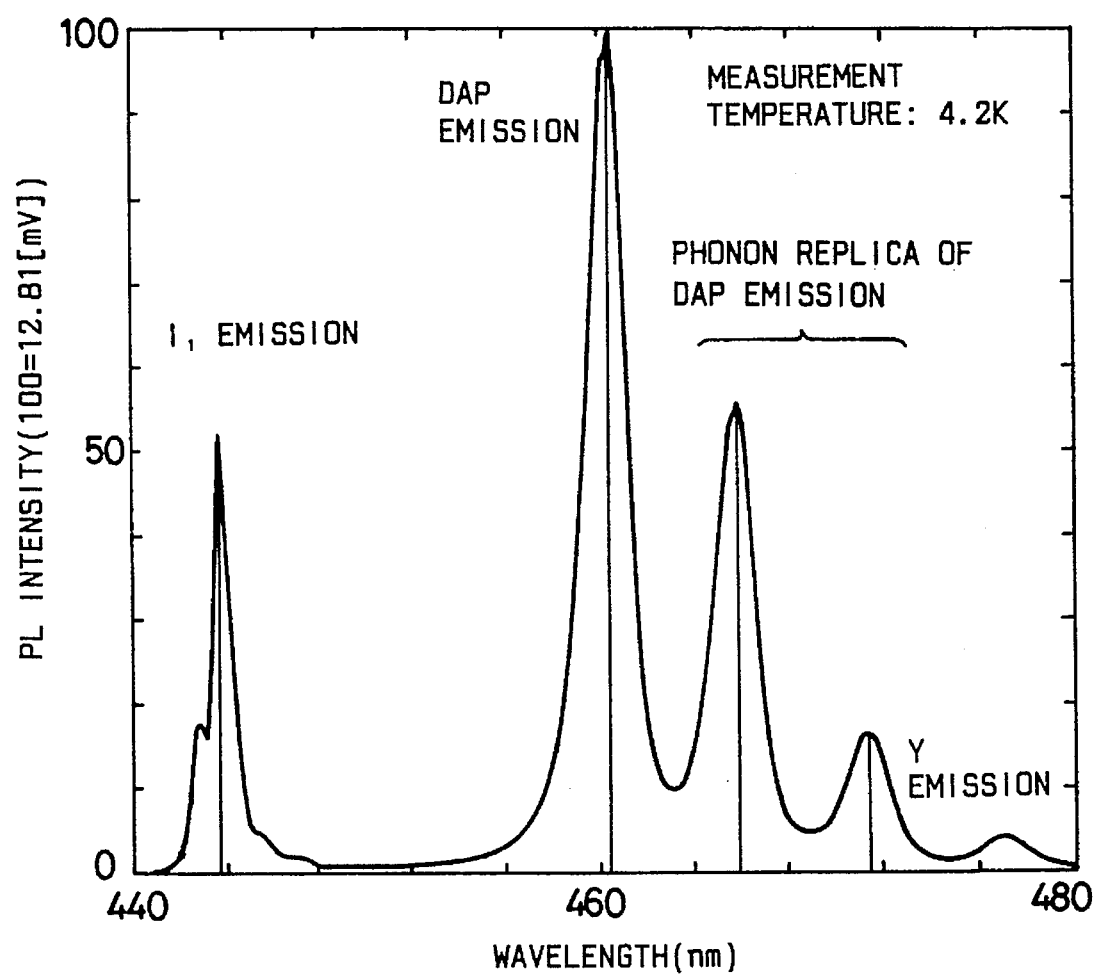
FIG. 14 is a graph showing a result of measurement of photoluminescence spectrum of the p-type ZnSe layer grown by the method according to the second embodiment of the invention.

FIG. 14 shows a result of measurement of photoluminescence spectrum of the ZnSe:N layer 22 epitaxially grown as stated above at 4.2K. The growth temperature is 450° C., and the pressure in the reaction tube 6 is 650 Torr. Supplied amounts of DMZn, DMSe and Di—PNH are 5 µmol/minute, 10 µmol/minute, and 75 µmol/minute, respectively. During the process, DMSe was supplied intermittently, with the cycle of four seconds for supply and two seconds for interruption, so as to interrupt the growth momentarily. The ordinate of FIG. 14 has a full scale different from those of FIGS. 4 and 5.

Referring to FIG. 14 in comparison with FIG. 4, DAP emission of an intensity equivalent to or even larger than that shown in FIG. 4 can be seen also in FIG. 14. That is, although the amount of Di—PNH supplied as the p-type dopant during the growth is a half, the intensity of DAP emission of the ZnSe:N layer 22 grown by the method according to the second embodiment is equivalent to or even larger than the intensity of DAP emission of the ZnSe:N layer 22 grown by the method according to the first embodiment which is configured to supply all of DMZn, DMSe and Di—PNH continuously. Apparently, therefore, the method according to the second embodiment promotes more efficient incorporation of N atoms into the crystal and hence provides a higher N doping efficiency than the method according to the first embodiment provides.

As stated above, the method according to the second embodiment not only uses Di—PNH as a p-type dopant but also proceeds the growth by alternately repeating steps of growing ZnSe:N layers 22 by simultaneously supplying DMZn as the Zn material, DMSe as the Se material and Di—PNH as the p-type dopant, altogether, and steps of interrupting the growth by interrupting the supply of DMSE, while continuing the supply of DMZn and Di—PNH, so as to meanwhile permit N and Zn to adsorb to the crystal to form adsorptive layers 24 of N and Zn. Therefore, N is incorporated into ZnSe with a high efficiency, which enables growth of the ZnSe:N layer 22 of a desired thickness doped with a high concentration of N, that is, a p-type ZnSe layer with a high acceptor concentration.

Next explained is an effect obtained by annealing the ZnSe:N layer after epitaxially grown. In order to investigate the effect, a sample was made by epitaxially growing a 2 µm thick ZnSe:N layer on a semi-insulating GaAs substrate in the same manner as the first embodiment and then forming a 0.1 µm thick silicon dioxide film ($SiO_2$ film) on the ZnSe:N layer by vacuum evaporation. The growth temperature is 450° C., and the pressure in the reaction tube 6 is 650 Torr. Amounts of DMZn supplied as a material of Zn, DMSe as a material of Se and Di—PNH as a p-type dopant are 9.53 µmol/minute, 38.36 µmol/minute and 141 µmol/minute, respectively. The SiO$_2$ film formed on the ZnSe:N layer is used to prevent desorption of N from the ZnSe:N layer during annealing. The sample, thus made, was subjected to RTA (rapid thermal annealing) at 700° C. for 10 seconds by using an annealing apparatus of a radio-frequency (RF) heating type (not shown). After that, the SiO$_2$ film was removed by etching using hydrofluoric acid.

Figure 15:
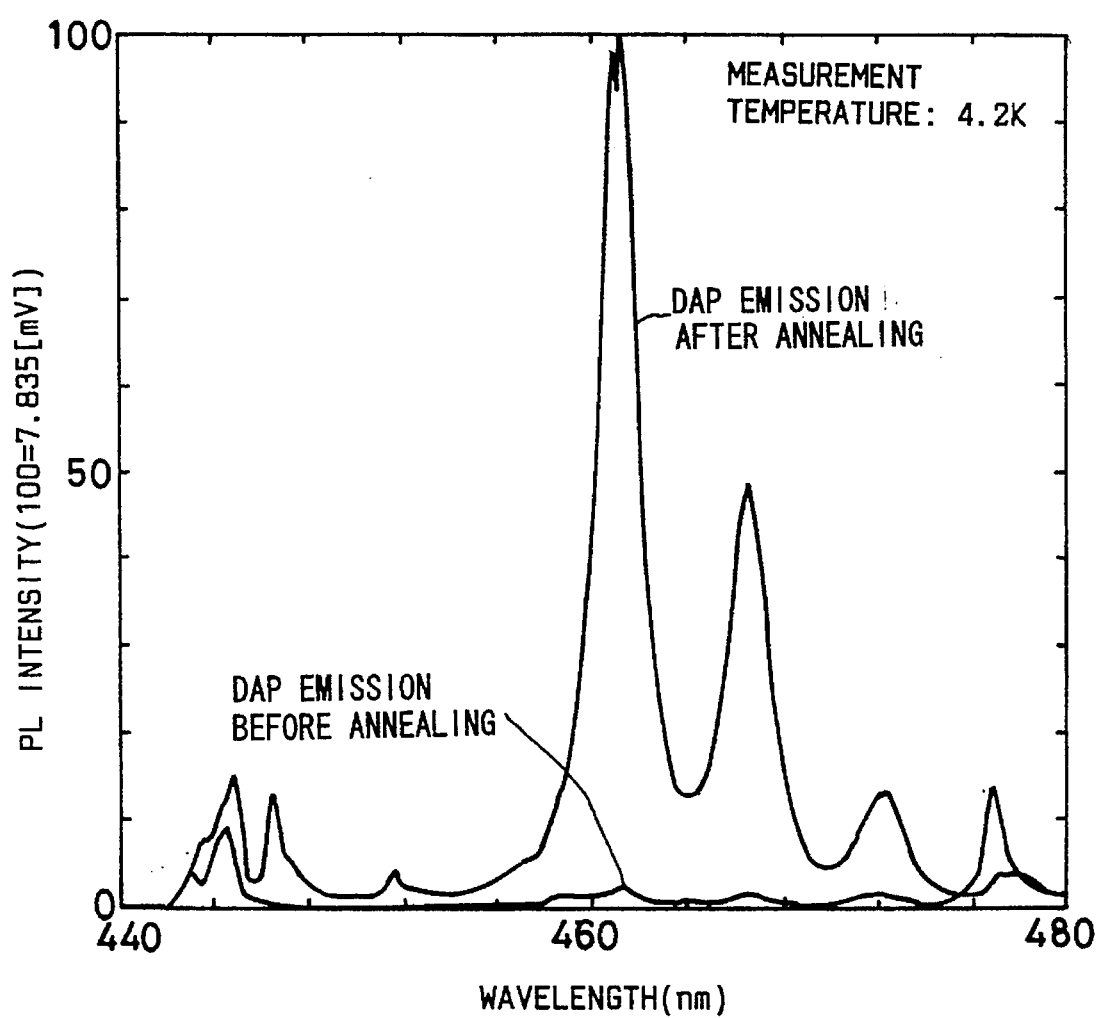
FIG. 15 is a graph showing a result of measurement of photoluminescence spectrum of the p-type ZnSe layer before and after annealing.

FIG. 15 shows a result of measurement of photoluminescence spectrum of the ZnSe:N layer before and after the annealing at 4.2K. As shown in FIG. 15, substantially no DAP emission occurs before annealing, but prominent DAP emission occurs after annealing at 700° C. for 10 seconds. This phenomenon permits the interpretation that N in the ZnSe:N layer epitaxially grown under the aforesaid conditions remains substantially inactive before annealing, but is activated by annealing.

Figure 16:
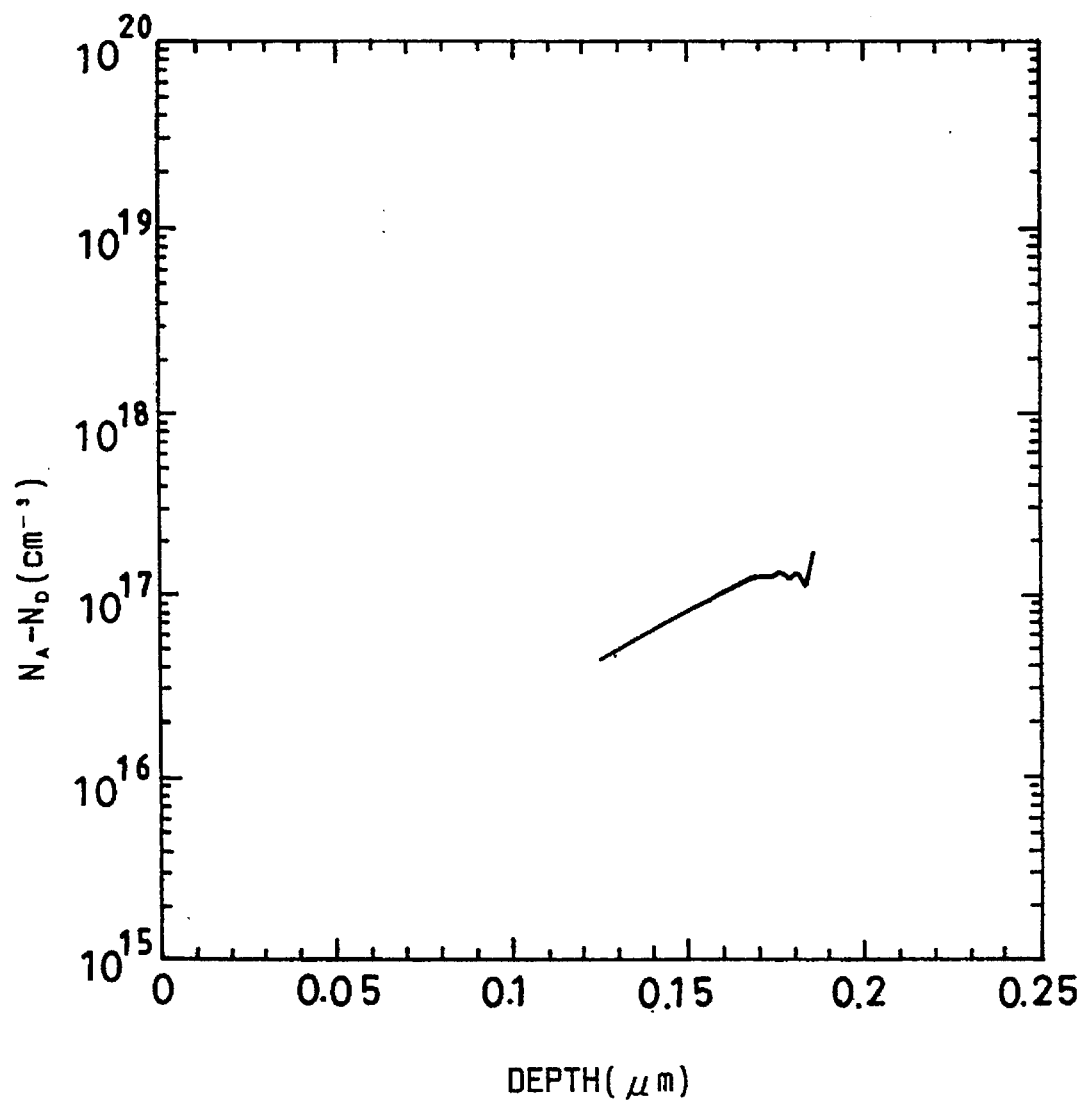
FIG. 16 is a graph showing a profile of the effective acceptor concentration measured on the sample from which the photoluminescence spectrum shown in FIG. 15 is obtained.

FIG. 16 shows the effective acceptor concentration ($N_A - N_D$) of the ZnSe:N layer taken in the direction downward from its surface by the same method referred to above with reference to the first embodiment. This reveals that $N_A - N_D \sim 1 \times 10^{17} \text{cm}^{-3}$. This value of the effective acceptor concentration is higher by one order of magnitude than conventional ones.

It is now apparent that annealing the ZnSe:N layer, after epitaxially grown, activates N in the ZnSe:N layer and hence provides a ZnSe:N layer, that is, a p-type ZnSe layer, with a remarkably high acceptor concentration.

Next explained below is a third embodiment in which the invention is applied to fabrication of semiconductor laser using II–VI compound semiconductors. A semiconductor laser made by the third embodiment has a so-called SCH structure (separate confinement heterostructure).

Figure 17:
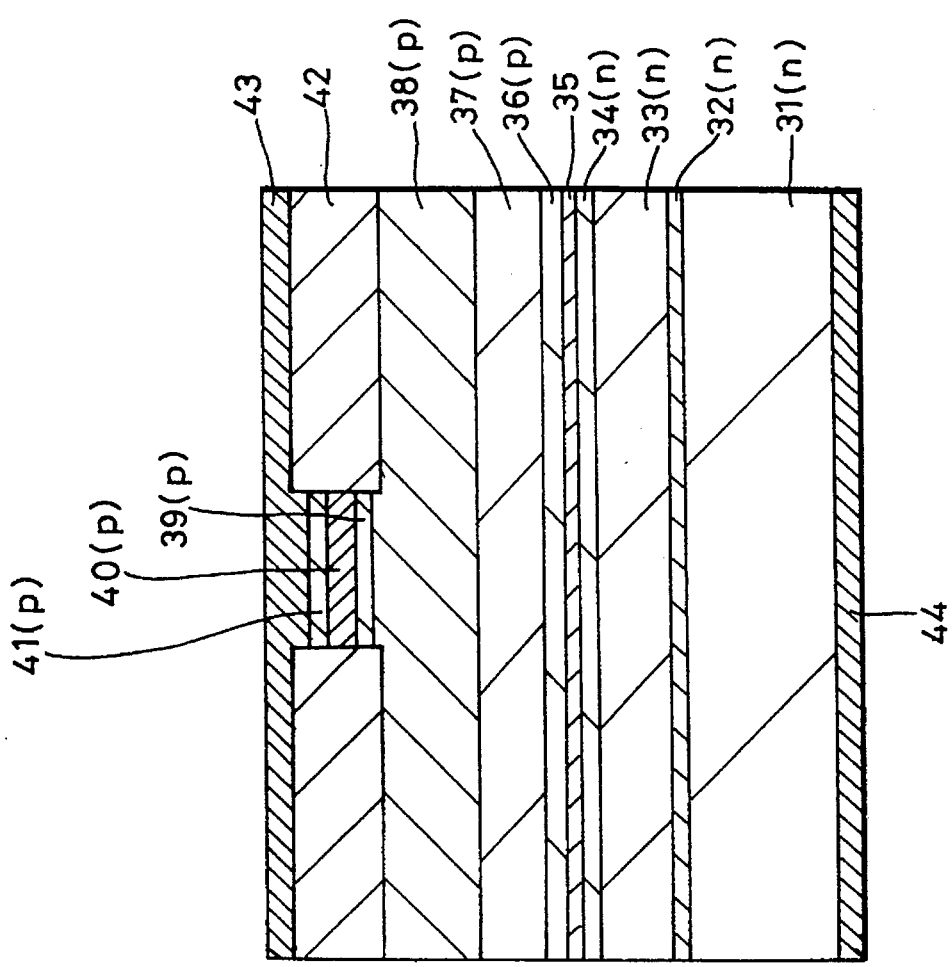
FIG. 17 is a cross-sectional view of a semiconductor laser made by a method for fabricating a semiconductor laser according to a third embodiment of the invention, taken along a line normal to its cavity-lengthwise direction.
Figure 18:
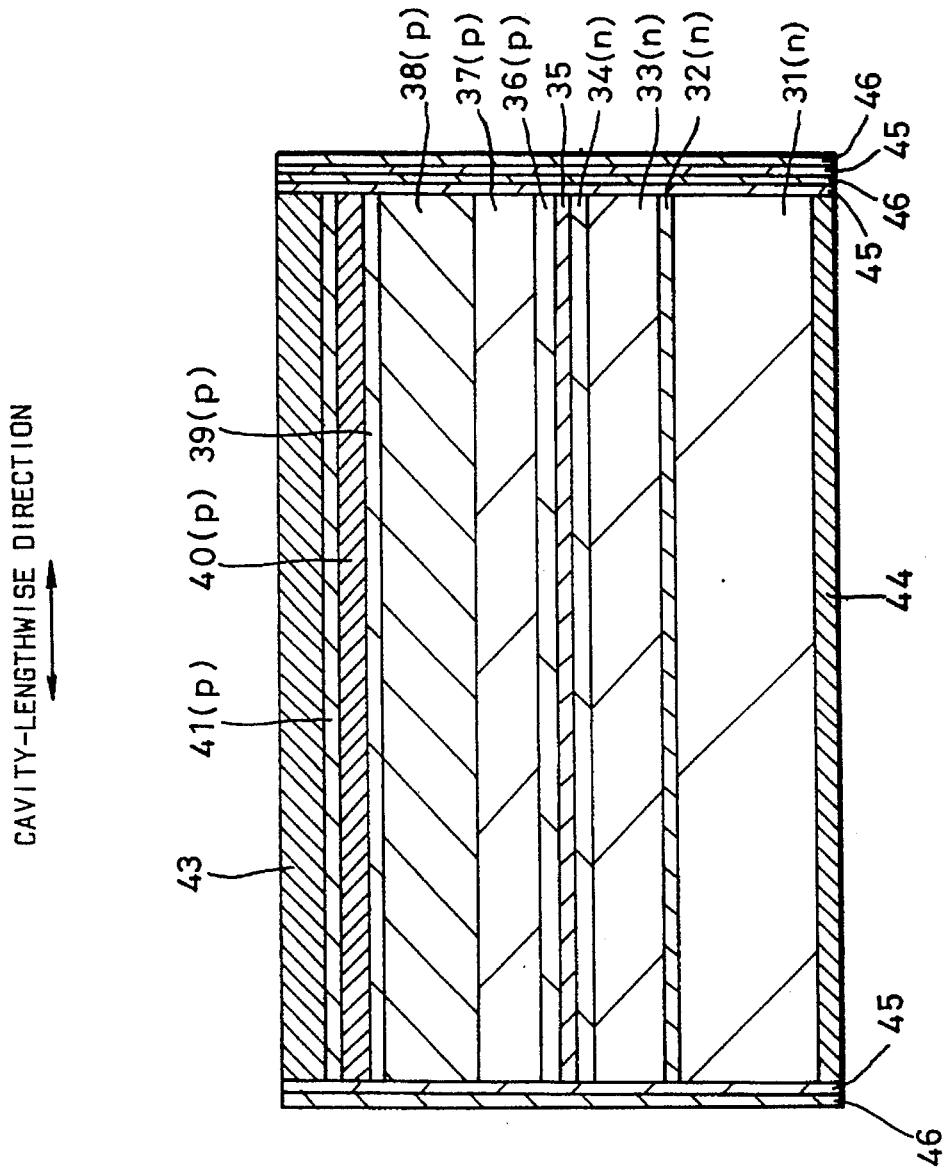
FIG. 18 is a cross-sectional view of the semiconductor laser made by the method for fabricating a semiconductor laser according to the third embodiment of the invention, taken along a line parallel to its cavity-lengthwise direction.

FIGS. 17 and 18 show a semiconductor laser fabricated by the method according to the third embodiment. FIG. 17 is a cross-sectional view taken along a line normal to the cavity-lengthwise direction of the semiconductor laser. FIG. 18 is a cross-sectional view taken along a line parallel to the cavity-lengthwise direction of the semiconductor laser.

As shown in FIGS. 17 and 18, the method according to the third embodiment epitaxially grows layers on a (100)-oriented n-type GaAs substrate 31 doped with silicon (Si) as a donor impurity, for example, by MOCVD including the same step of interrupting the growth by flow modulation as the step of the second embodiment: namely, in sequence, an n-type ZnSe buffer layer 32 doped with iodine (I), for example, as a donor impurity; an n-type $Zn_{1-p}Mg_pS_qSe_{1-q}$ cladding layer 33 doped with I, for example, as a donor impurity; an n-type ZnSe waveguide layer 34 doped with I, for example, as a donor impurity; an active layer 35 comprising an intrinsic (i-type) $Zn_{1-z}Cd_zSe$ quantum well layer, for example; a p-type ZnSe waveguide layer 36 doped with N, for example, as an acceptor impurity; a p-type $Zn_{1-p}Mg_pS_qSe_{1-q}$ cladding layer 37 doped with N, for example, as an acceptor impurity; a p-type $ZnS_ySe_{1-y}$ layer 38 doped with N, for example, as an acceptor impurity; a p-type ZnSe contact layer 39 doped with N, for example, as an acceptor impurity; a p-type ZnTe/ZnSe multi-quantum-well layer (MQW) 40 comprising alternately stacked p-type ZnTe quantum well layers and p-type ZnSe barrier layers doped with N, for example, as an acceptor impurity; and a p-type ZnTe contact layer 41 doped with N, for example, as an acceptor impurity. The p-type ZnTe/ZnSe MQW layer 40 will be explained later in greater detail.

In this case, used for the epitaxial growth of the n-type ZnSe buffer layer 32 and the n-type ZnSe waveguide layer 34 are, for example, DMZn as the material of Zn, DMSe as the material of Se, and ethyl iodide as the material of the dopant of I. Used for the epitaxial growth of the n-type $Zn_{1-p}Mg_pS_qSe_{1-q}$ cladding layer 33 are, for example, DMZn as the material of Zn, hismethyl cyclopentadienyl magnesium ((MeCp)$_2$Mg) as the material of Mg, diethyl sulfur (DES) as the material of S, DMSe as the material of Se, and ethyl iodide as the dopant of I. Used for the epitaxial growth of the active layer 35 comprising the i-type $Zn_{1-z}Cd_zSe$ quantum well layer are, for example, DMZn as the material of Zn, dimethyl cadmium, (DMCd) as the material of Cd, and DMSe as the material of Se.

Used for the epitaxial growth of the p-type ZnSe waveguide layer 36, p-type ZnSe contact layer 39, and p-type ZnSe layers of the p-type ZnTe/ZnSe MQW layer 40 are, for example, DMZn as the material of Zn, DMSe as the material of Se, and Di—PNH as the dopant of N. Used for the epitaxial growth of the p-type $Zn_{1-p}Mg_pS_qSe_{1-q}$ cladding layer 37 are, for example, DMZn as the material of Zn, (MeCp)$_2$Mg as the material of Mg, DES as the material of S, DMSe as the material of Se, and Di—PNH as the dopant of N. Used for the epitaxial growth of the p-type $ZnS_ySe_{1-y}$ layer 38 are, for example, DMZn as the material of Zn, H$_2$S as the material of S, DMSe as the material of Se, and Di—PNH as the dopant of N. Used for the epitaxial growth of the p-type ZnTe layers of the p-type ZnTe/ZnSe MQW layer 40 and the p-type ZnTe contact layer 41 are, for example, DMZn as the material of Zn, diethyl tellurium (DETe) as the material of Te, and Di—PNH as the dopant of N.

The process for epitaxially growing the n-type ZnSe buffer layer 32 and the n-type ZnSe waveguide layer 34 alternately repeats the step of promoting the growth by supplying all of DMZn, DMSe and ethyl iodide simultaneously and the step of interrupting the growth by interrupting the supply of one of the materials, DMSe, for example, while continuing the supply of the other materials, DMZn and ethyl iodide. The process for epitaxially growing the n-type $Zn_{1-p}Mg_pS_qSe_{1-q}$ cladding layer 33 alternately repeats the step of promoting the growth by supplying all of DMZn, (MeCp)$_2$Mg, DES, DMSe and ethyl iodide simultaneously and the step of interrupting the growth by interrupting the supply of DES and DMSe, for example, while continuing the supply of DMZn, (MeCp)$_2$Mg and ethyl iodide.

Also the process for epitaxially growing the p-type ZnSe waveguide layer 36, p-type ZnSe contact layer 39, and p-type ZnSe layers of the p-type ZnTe/ZnSe MQW layer 40 alternately repeats the step of promoting the growth by supplying all of DMZn, DMSe and Di—PNH simultaneously and the step of interrupting the growth by interrupting the supply of DMSe while continuing the supply of DMZn and Di—PNH. Again, also the process for epitaxially growing p-type $Zn_{1-p}Mg_pS_qSe_{1-q}$ cladding layer 37 alternately repeats the step of promoting the growth by supplying all of DMZn, (MeCp)$_2$Mg, DES, DMSe and Di—PNH simultaneously and the step of interrupting the growth by interrupting the supply of DES and DMSe while continuing the supply of DMZn, (MeCp)$_2$Mg and Di—PNH. The process for epitaxially growing the p-type $ZnS_ySe_{1-y}$ layer 38 alternately repeats the step of promoting the growth by supplying all of DMZn, DES, DMSe and Di—PNH simultaneously and the step of interrupting the growth by interrupting the supply of DES and DMSe while maintaining the supply of DMZn and Di—PNH. Further again, the process for the growth of the p-type ZnTe layers of the p-type ZnTe/ZnSe MQW layer 40 and the p-type ZnTe contact layer 41 alternately repeats the step of promoting the growth by supplying all of DMZn, DETe and Di—PNH simultaneously and the step of interrupting the growth by interrupting the supply of DETe while maintaining the supply of DMZn and Di—PNH.

After a stripe-shaped resist pattern (not shown) with a predetermined width is made on the p-type ZnTe contact layer 41, etching is done by using the resist pattern as a mask and by wet etching, for example, up to an intermediate depth of the p-type $ZnS_vSe_{1-v}$ 38. As a result, the upper part of the p-type $ZnS_vSe_{1-v}$ layer 38, p-type ZnSe contact layer 39, p-type ZnTe/ZnSe MQW layer 40 and p-type ZnTe contact layer 41 are patterned into a stripe. The width of the etched stripe portion is, for example, 5 μm.

While the resist pattern used for the precedent etching is maintained, an alumina ($Al_2O_3$) film is made on the entire surface of the structure up to the thickness of 300 nm, for example, by vacuum evaporation. After that, the resist pattern is removed together with the overlying $Al_2O_3$ film (lift-off). As a result, an insulating layer 42 comprising the $Al_2O_3$ film is made only on selective portions of the p-type $ZnS_vSe_{1-v}$ layer 38 except for the stripe portion.

Next made on the entire surface of the stripe-shaped p-type ZnTe contact layer 41 and the insulating layer 42 is a p-side electrode 43 comprising a Pd/Pt/Au electrode by sequentially stacking a Pd film of 10 nm thick, for example, a Pt film of 100 nm thick, for example, and a Au film of 300 nm thick, for example, by vacuum evaporation. After that, by annealing the structure, if necessary, the p-side electrode 43 is brought into ohmic contact with the p-type ZnTe contact layer 41. The portion of the p-side electrode 43 in contact with the p-type ZnTe contact layer 41 behaves as a path of electric currents. Made on the back surface of the n-type GaAs substrate 31 is an n-side electrode 44 such as an In electrode.

After that, the n-type GaAs substrate 31 having formed the laser structure on it in the foregoing process is cleaved into bars to form opposite cavity-end surfaces. On the front one of the cavity-end surfaces from which a laser beam is to be emanated, a multi-layered film comprising an $Al_2O_3$ film 45 and a Si film 46 is formed. On the other cavity-end surface not for emanating a laser beam, a multi-layered film comprising double-cyclic reputation of $Al_2O_3$ films 45 and Si films 46 is formed. The thickness of the multilayered film comprising the $Al_2O_3$ films 45 and the Si films 46 is determined such that the optical distance obtained by multiplying the thickness by the refractive index be equal to ¼ of the laser oscillating wavelength. By making such end coating, the refractive index of the front end surface can be 70%, and that of the rear end surface can be 95%. After making the end coating, the bar is again cleaved into chips, and used for packaging.

In the semiconductor laser according to the third embodiment, the thickness of the i-type $Zn_{1-z}Cd_zSe$ quantum well layer constituting the active layer 35 is preferably 2~20 nm, and may be 9 nm, for example.

in regards the n-type $Zn_{1-p}Mg_pS_qSe_{1-q}$ cladding layer 33 and the p-type $Zn_{1-p}Mg_pS_qSe_{1-q}$ cladding layer 37, Mg composition ratio p is 0.09, for example, S composition ratio q is 0.18, for example, and corresponding energy gap $E_g$ is about 2.94 eV at 77K. These n-type $Zn_{1-p}Mg_pS_qSe_{1-q}$ cladding layer 33 and p-type $Zn_{1-p}Mg_pS_qSe_{1-q}$ cladding layer 37 having the Mg composition ratio p=0.09 and the S composition ratio q=0.18 get into lattice matching with GaAs. The Cd composition ratio z of the i-type $Zn_{1-z}Cd_zSe$ quantum well layer constituting the active layer 35 may be 0.19, for example, and the corresponding energy gap $E_g$ is about 2.54 eV at 77K. Then, difference $\Delta E_g$ in energy gap $E_g$ of the n-type $Zn_{1-p}Mg_pS_qSe_{1-q}$ cladding layer 33 and the p-type $Zn_{1-p}Mg_pS_qSe_{1-q}$ cladding layer 37 from that of the i-type $Zn_{1-z}Cd_zSe$ quantum well layer constituting the active layer 35 is 0.40 eV. The value of the energy gap $E_g$ at room temperature can be obtained by subtracting 0.1 eV from the value of the energy gap $E_g$ at 77K.

The n-type $Zn_{1-p}Mg_pS_qSe_{1-q}$ cladding layer 33 is 0.8 μm thick, for example, the n-type ZnSe waveguide layer 34 is 60 nm thick, for example, the p-type ZnSe waveguide layer 36 is 60 nm thick, for example, the p-type $Zn_{1-p}Mg_pS_qSe_{1-q}$ cladding layer 37 is 0.6 μm thick, for example, the p-type $ZnS_vSe_{1-v}$ layer 38 is 0.6 μm thick, for example, the p-type ZnSe contact layer 39 is 45 nm, for example, and the p-type ZnTe contact layer 11 is 70 nm, for example.

The thickness of the n-type ZnSe buffer layer 32 is determined sufficiently smaller than the critical thickness of ZnSe (~100 nm), that is, 33 nm, for example, in order to prevent dislocation during epitaxial growth of the n-type ZnSe buffer layer 32 and overlying respective layers, which may occur due to lattice mismatching, although slight, between ZnSe and GaAs.

The p-type $ZnS_vSe_{1-v}$ layer 38 on the p-type $Zn_{1-p}Mg_pS_qSe_{1-q}$ layer 37 represents one or more of behaviors, in case by case, such as behaving as a second p-type cladding layer added to the p-type $Zn_{1-p}Mg_pS_qSe_{1-q}$ cladding layer 37, behaving to establish lattice matching with the p-type $Zn_{1-p}Mg_pS_qSe_{1-q}$ cladding layer 37, behaving as a spacer layer for preventing short-circuit which might be caused by creeping-up of a solder along the chip end surface when a laser chip is mounted on a heat sink. Although the Mg composition ratio p and S composition ratio q of the p-type $Zn_{1-p}Mg_pS_qSe_{1-q}$ cladding layer 37 must be taken into consideration, the S composition ratio v of the p-type $ZnS_vSe_{1-v}$ layer 38 is chosen from the range of 0<v≤0.1, more preferably 0.06≤v≤0.08, and the optimum S composition ratio for lattice matching with the p-type $Zn_{1-p}Mg_pS_qSe_{1-q}$ cladding layer 37 is 0.06.

The use of the p-type ZnTe/ZnSe MQW layer 40 is for the purpose of not producing a barrier effectively because direct contact of the p-type ZnSe contact layer 39 with the p-type ZnTe contact layer 41 would cause a large discontinuity in valence bands at the contacting interface, which would behave as a barrier for holes injected from the p-side electrode 43 into the p-type ZnTe contact layer 41.

More specifically, maximum carrier concentration in p-type ZnSe is around $5 \times 10^{17}$ cm$^{-3}$ whereas carrier concentration in p-type ZnTe can be $10^{18}$ cm$^{-3}$ or more. The dimension of the discontinuity in valence bands at the p-type ZnSe/p-type ZnTe interface is about 0.5 eV. At the junction between p-type ZnSe and p-type ZnTe, if it is a step junction, the valence band of p-type ZnSe bends over the width $$W = (2\epsilon \phi_r / qN_A)^{1/2} \quad (1)$$

where $\epsilon$ is the dielectric constant of ZnSe, and $\phi_r$ is the dimension of the discontinuity in valence bands at the p-type ZnSe/p-type ZnTe interface (about 0.5 eV).

Figure 19:
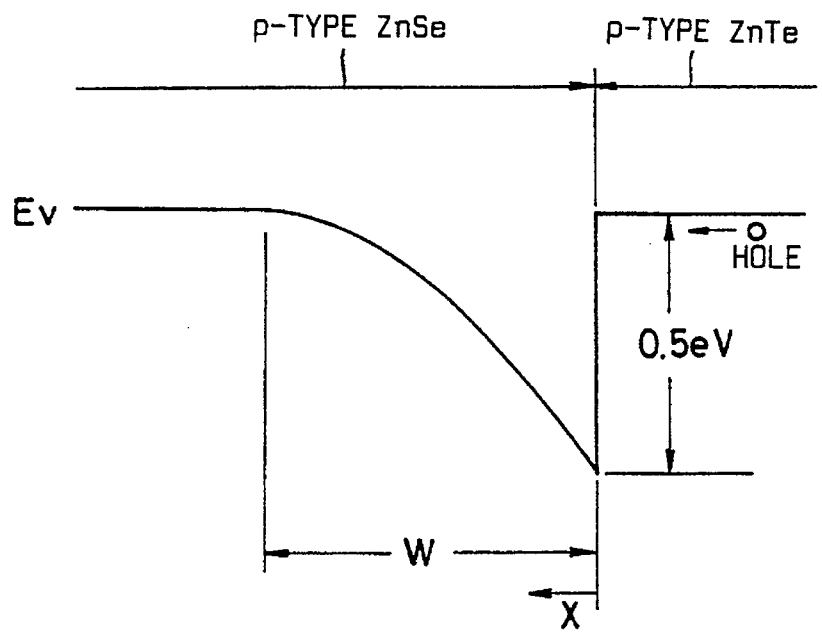
FIG. 19 is an energy band diagram showing valence bands near the interface between p-type ZnSe and p-type ZnTe.

Calculation of W using Equation (1) results in W=32 nm. FIG. 19 shows how the top of a valence band changes in the direction normal to the interface between p-type ZnSe and p-type ZnTe interface. Note that Fermi levels of p-type ZnSe and p-type ZnTe are similar when coinciding with tops of their valence bands. In this case, the valence band of p-type ZnSe bends downwardly (toward lower energies) toward p-side ZnTe as shown in FIG. 19. This change in valence band having a downwardly pointing representation behaves as a potential barrier against holes injected from the p-side electrode 43 into the p-type ZnSe/p-type ZnTe junction.

This problem can be solved by providing the p-type ZnTe/ZnSe MQW layer 40 between the p-type ZnSe contact layer 39 and the p-type ZnTe contact layer 41. A specific design of the p-type ZnTe/ZnSe MQW layer 40 is explained below.

Figure 20:
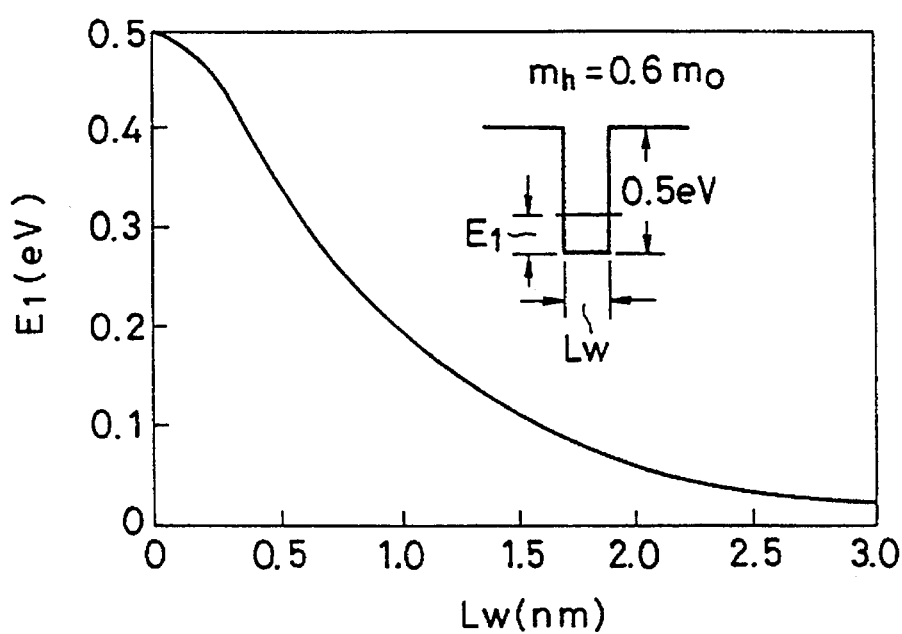
FIG. 20 is a graph showing changes in first quantum level $E_1$ relative to width $L_w$ of a quantum well comprising p-type ZnTe.

FIG. 20 shows a result of a quantum-mechanical calculation of a well-type potential of a finite barrier to know how the first quantum level $E_1$ changes with the width $L_w$ of the quantum well of p-type ZnTe in a single-quantum- well structure in which the p-type ZnTe quantum well layer is sandwiched by p-type ZnSe barrier layers. The calculation uses 0.6 $m_0$ ($m_0$: mass of an electron at rest in vacuum) as the mass of an electron in the quantum well layer and the barrier layer, presuming it being equal to the effective mass $m_h$ of a hole in p-type ZnSe and p-type ZnTe, and assumes the depth of the well being 0.5 eV.

It is known from FIG. 20 that, by decreasing the width $L_w$ of the quantum well, the first quantum level $E_1$ formed in the quantum well can be made higher. The p-type ZnTe/ZnSe MQW layer 40 is designed by using the theory.

In this case, the bending in the band of p-type ZnSe over the width W from the interface between p-type ZnSe and p-type ZnTe is given by a quadratic function of the distance x (FIG. 19) from the same interface $$\phi(x)=\phi_T\{1-(x/W)^2\} \quad (2)$$

Therefore, the p-type ZnTe/ZnSe MQW layer 40 can be designed, based on Equation (2), by stepwise changing $L_w$, such that first quantum levels $E_1$ formed in respective p-type ZnTe quantum well layers coincide with top energies of valence bands of p-type ZnSe and p-type ZnTe, and are equal to each other.

Figure 21:
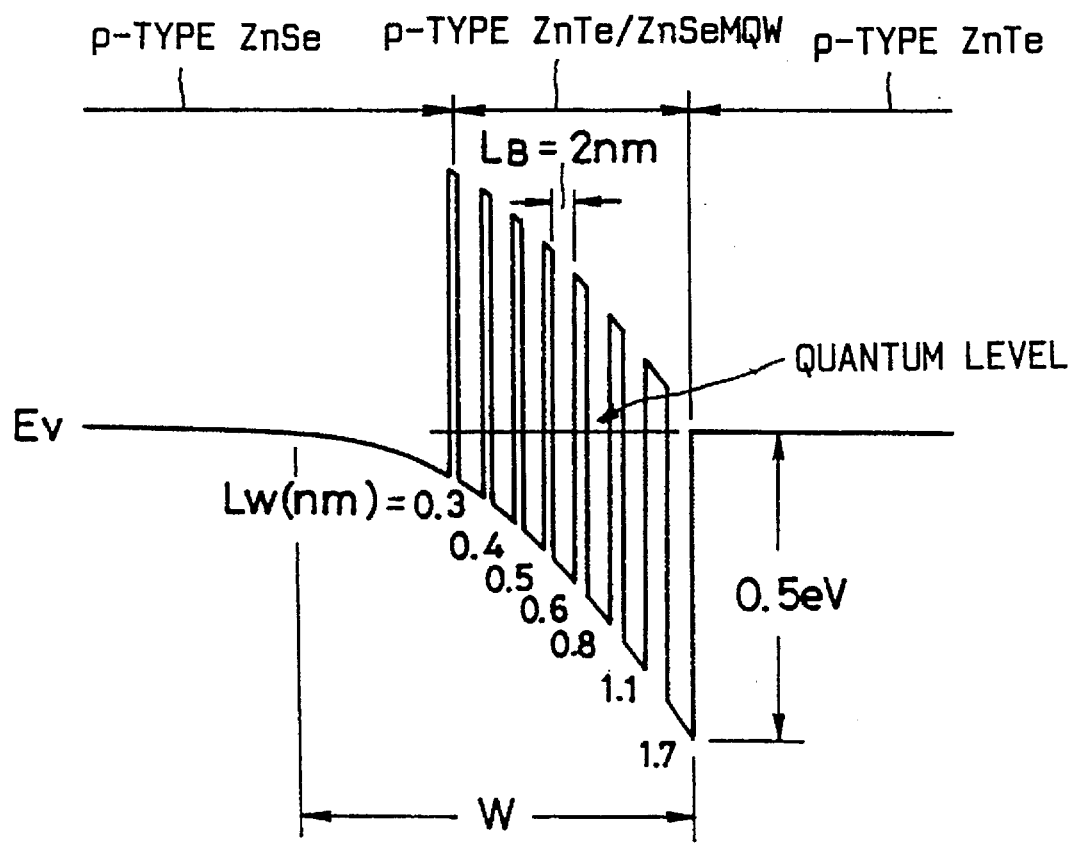
FIG. 21 is a schematic diagram showing a design of a p-type ZnTe/ZnSe MQW layer in a semiconductor laser made by the third embodiment of the invention.

FIG. 21 shows a design of the widths $L_w$ of quantum well layers of the p-type ZnTe/ZnSe MQW layer 40 when the width of its each barrier layer of p-type ZnSe is 2 nm. In this case, acceptor concentration $N_A$ of the p-type ZnSe contact layer 39 is $5\times10^{17}$cm$^{-3}$, and acceptor concentration of $N_A$ of the p-type ZnTe contact layer 41 is $1\times10^{19}$cm$^{-3}$. As shown in FIG. 21, widths $L_w$ of seven quantum wells, in total, are made to vary such that their first quantum levels $E_1$ coincide with Fermi levels of p-type ZnSe and p-type ZnTe; that is, from the p-type ZnSe contact layer 39 toward the p-type ZnTe contact layer 41, $L_w$=0.3 nm, 0.4 nm, 0.5 nm, 0.6 nm, 0.8 nm, 1.1 nm, and 1.7 nm.

Upon designing widths of quantum wells, in a strict sense, interactions among the quantum wells must be considered because their levels couple with each other, and effects of distortions caused by lattice mismatching between quantum wells and barrier layers must be incorporated as well. Theoretically, however, it is sufficiently possible to make the quantum levels of the multi-quantum-wells flat as shown in FIG. 21.

In FIG. 21, since holes injected into p-type ZnTe can flow to p-type ZnSe by resonant tunneling through first quantum levels $E_1$ formed in respective quantum wells in the p-type ZnTe/ZnSe MQW layer 40, substantially no potential barrier is produced at the interface between p-type ZnSe and p-type ZnTe.

As described above, the third embodiment, like the second embodiment, can make p-type layers with sufficiently high acceptor concentrations by using Di—PNH as a p-type dopant for epitaxial growth of p-type layers constituting a laser structure and by employing the step of interrupting the growth by interrupting the supply of materials of group VI elements. In addition, also for epitaxial growth of n-type layers constituting the laser structure, by employing the step of temporarily interrupting the growth of n-type layers by interrupting the supply of materials of group II elements, the third embodiment can increase donor concentrations of these n-type layers. Therefore, a semiconductor laser for emission of light with a short wavelength, with a low threshold current density and high performance can be realized. More specifically, a semiconductor laser having the ability of continuous oscillation at room temperature and emission of green light, for example, can be realized. It is also possible to reduce the voltage necessary for laser oscillation.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the third embodiment has been explained as applying the invention to fabrication of a semiconductor laser having an SCH structure, the invention may also be applied to fabrication of a semiconductor laser having a DH structure (double heterostructure).

Although the third embodiment has been described as applying the invention to fabrication of a semiconductor laser, the invention may be used for fabrication of light emitting diodes or other various semiconductor devices using II–VI compound semiconductors.

The GaAs substrate used as the compound semiconductor substrate in the first to third embodiments may be replaced by, for example, a GaP substrate.

Also usable as p-type dopants used upon epitaxial growth of II–VI compound semiconductors by MOCVD or MBE using gaseous materials are organic compounds, such as cyanamide (H—N=C=N—H), in which each N atom combines with another atom with double bonds.

Further, organic compounds used as p-type dopants in the invention, that is, those each including at least one nitrogen atom and at least two groups of atoms each having a molecular weight larger than 12 and both combined with the nitrogen atom, may be used as materials of N for growing nitrogen-containing compound semiconductors such as GaN (a kind of III–V compound semiconductors) by vapor deposition.

As described above, by using as a p-type dopant an organic compound including at least one nitrogen atom and at least two groups of atoms each having a molecular weight larger than 12 and both combined with the nitrogen atom, the invention can grow p-type II–VI compound semiconductors with sufficiently high acceptor concentrations.

What is claimed is:

1. A method for making a p-doped II–VI compound semiconductor comprising:

providing a substrate having a surface; and forming a p-doped II–VI compound semiconductor layer on said surface by vapor deposition using a vapor comprising: a material of a group II element, a material of a group VI element and a p-type dopant selected from the group consisting of secondary and tertiary amines having the formula:

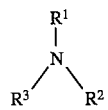

wherein $R^1$ is hydrogen or $R^2$, and $R^2$ and $R^3$ are independently straight or branched chain alkyl groups each having a molecular weight of greater than 12.

2. The method for making a p-doped II–VI compound semiconductor according to claim 1 wherein each of said alkyl groups has a molecular weight larger than 36.

3. The method for making a p-doped II–VI compound semiconductor according to claim 1 wherein said $R^2$ and $R^3$ are alkyl groups equal in molecular weight.

4. The method for making a p-doped II–VI compound semiconductor according to claim 1 wherein said p-type dopant is a secondary amine of the formula wherein $R^1$ is hydrogen and $R^2$ and $R^3$ are alkyl groups having a molecular weight larger than 36.

5. The method for making a p-doped II–VI compound semiconductor according to claim 1 wherein said p-type dopant is a tertiary amine of the formula wherein $R^1$, $R^2$ and $R^3$ are alkyl groups having a molecular weight larger than 36.

6. The method for making a p-doped II–VI compound semiconductor according to claim 4 wherein said secondary amine is selected from the group consisting of di-isopropylamine, dipropylamine, dibutylamine, di-isobutylamine, di-secondary-butylamine and di-tertiary-butylamine.

7. The method for making a p-doped II–VI compound semiconductor according to claim 5 wherein said tertiary amine is selected from the group consisting of tripropylamine, triisopropylamine, tri-butylamine, tri-isobutylamine, tri-secondary-butylamine, tri-tertiary-butylamine, di-isopropyl methylamine, dipropyl methylamine, dibutyl methylamine, di-isobutyl methylamine, di-secondary-butylmethylamine and di-tertiary butylmethylamine.

8. The method for making a p-doped II–VI compound semiconductor according to claim 1 wherein nitrogen atoms are δ-doped to the plane of group II elements of said II–VI compound semiconductor.

9. The method for making a p-doped II–VI compound semiconductor according to claim 1 wherein in said forming step supply of the material of said group VI element in said vapor is interrupted while maintaining a supply of said material of said group II element and said p-type dopant.

10. The method for making a p-doped II–VI compound semiconductor according to claim 1 wherein said vapor deposition is metallorganic chemical vapor deposition or molecular beam epitaxy using gaseous materials.

* * * * *